US012686036B2

(12) United States Patent
Park et al.

(10) Patent No.: US 12,686,036 B2
(45) Date of Patent: Jul. 21, 2026

(54) CLEANING APPARATUS AND SUBSTRATE PROCESSING APPARATUS

(71) Applicant: Samsung Electronics Co., Ltd., Suwon-si (KR)

(72) Inventors: Sangjine Park, Suwon-si (KR); Ji Hwan Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 129 days.

(21) Appl. No.: 18/928,329

(22) Filed: Oct. 28, 2024

(65) Prior Publication Data

US 2025/0332620 A1      Oct. 30, 2025

(30) Foreign Application Priority Data

Apr. 30, 2024    (KR) ........................ 10-2024-0057635

(51) Int. Cl.
| | |
|---|---|
| *B08B 3/02* | (2006.01) |
| *B05B 1/14* | (2006.01) |
| *H10P 72/00* | (2026.01) |

(52) U.S. Cl.
CPC ................ *B08B 3/022* (2013.01); *B05B 1/14* (2013.01); *B08B 3/024* (2013.01); *B08B 2203/0264* (2013.01); *H10P 72/0414* (2026.01)

(58) Field of Classification Search
CPC ...................................................... B08B 3/022
See application file for complete search history.

(56) References Cited

U.S. PATENT DOCUMENTS

| | | | |
|---|---|---|---|
| 7,935,217 | B2 | 5/2011 | Yashiki et al. |
| 8,887,741 | B2 | 11/2014 | Higashijima et al. |
| 11,217,452 | B2 | 1/2022 | Izumoto et al. |
| 2007/0082460 | A1 | 4/2007 | Ishida |
| 2007/0202446 | A1 | 8/2007 | Takahashi et al. |
| 2022/0317574 | A1 | 10/2022 | Lee |

FOREIGN PATENT DOCUMENTS

| | | | |
|---|---|---|---|
| KR | 20150035388 A1 | * | 4/2015 |
| KR | 10-1659683 B1 | | 9/2016 |
| KR | 10-2029445 B1 | | 10/2019 |

* cited by examiner

*Primary Examiner* — Jason Y Ko

(74) *Attorney, Agent, or Firm* — Muir Patent Law, PLLC

(57) ABSTRACT

Provided is a cleaning apparatus that includes a nozzle configured to spray cleaning liquid, a nozzle extension comprising a nozzle extension body having a first aperture and a second aperture connected by a fluid passage in the nozzle extension body, the first aperture aligned with the nozzle and the second aperture for discharging the cleaning liquid, and the first aperture and the second aperture each have a normal direction oblique to each other, and a cover that encloses the second aperture and that comprises a first cover portion configured to cover at least a portion of a front surface of a substrate, a second cover portion configured to cover at least a portion of a rear surface of the substrate, and a third cover portion configured to cover at least a portion of a side of the substrate edge, wherein the cover comprises a placement groove configured to receive the substrate edge.

20 Claims, 22 Drawing Sheets

300

300

300

CLEANING APPARATUS AND SUBSTRATE PROCESSING APPARATUS

CROSS-REFERENCE TO RELATED APPLICATIONS

This application claims the benefit of Korean Patent Application No. 10-2024-0057635, filed on Apr. 30, 2024, in the Korean Intellectual Property Office, the disclosure of which is incorporated herein by reference in its entirety.

BACKGROUND

1. Field of the Invention

Example embodiments relate to a cleaning apparatus and a substrate processing apparatus, and more particularly, to a cleaning apparatus and a substrate processing apparatus including the cleaning apparatus.

2. Description of the Related Art

The process of processing a substrate, such as a semiconductor wafer, may include a process of forming a thin film, such as metal or photoresist, on one side of the substrate. In the process of forming a thin film, a thin film may be formed not only on the one side of the substrate, but also on the opposite side of the one side and the bevel area (e.g., a lateral surface between the one side of the substrate and the opposite side of the substrate). In the substrate processing process, it is generally preferable to form a thin film only on one side of the substrate, which is the area where a circuit will be formed. If a thin film is formed on the opposite side of the substrate, the thin film in the area may peel off in a subsequent process, and therefrom, a yield may decrease, or the desired substrate treatment may not be performed.

SUMMARY

An aspect of the inventive concept provides a cleaning apparatus, which may be referred to as a substrate cleaning apparatus, by which a substrate may be processed efficiently and impurities may be prevented from being scattered onto the substrate during the process.

Another aspect provides a substrate processing apparatus by which a substrate may be processed efficiently and impurities may be prevented from being scattered onto the substrate during the process.

Additional features and advantages of the inventive concept will be set forth in the description of example embodiments which follows, and in part will be apparent from the description of the embodiments.

According to an aspect, there is provided a cleaning apparatus including a nozzle configured to spray cleaning liquid, a nozzle extension comprising a nozzle extension body having that includes aperture at a first end coupled to the nozzle and a second aperture at a second end, the first aperture and the second aperture connected by a fluid passage in the nozzle extension body, the first aperture aligned with the nozzle and a second aperture configured to discharge the cleaning liquid, and the first aperture and the second aperture each have a normal direction oblique to each other, a cover that encloses the second aperture to receive the cleaning liquid from the second aperture, and that includes a first cover portion configured to cover at least a portion of a front surface of a substrate adjacent to a substrate edge, a second cover portion configured to cover at least a portion of a rear of the substrate adjacent to the substrate edge that is an opposite side of the front surface, and a third cover portion configured to cover at least a portion of a side of the substrate edge connecting between the front surface and the rear surface, wherein the cover includes a placement groove which is configured to receive the substrate edge, the placement groove being surrounded by the first cover portion, the second cover portion, and the third cover portion.

According to another aspect, there is provided a substrate processing apparatus including a cleaning apparatus that cleans a substrate and a substrate maintaining that maintains the substrate in a horizontal state, wherein the cleaning apparatus includes a nozzle configured to spray cleaning liquid, a nozzle extension including a nozzle extension body having a first aperture at a first end coupled to the nozzle and a second aperture at a second end, the first aperture and the second aperture connected by a fluid passage in the nozzle extension body, the first aperture aligned with nozzle and the second aperture for discharging the cleaning liquid, and the first aperture and the second aperture each having a normal direction oblique to each other, and a cover that encloses the second aperture to receive the cleaning liquid from the second aperture, and that includes a first cover portion configured to cover at least a portion of a front surface of a substrate adjacent to a substrate edge, a second cover portion configured to cover at least a portion of a rear surface of a substrate adjacent to the substrate edge, which is an opposite side of the front surface of the substrate, and a third cover portion configured to cover at least a portion of a side surface of the substrate edge connecting between the front surface and the rear surface. The cover includes a placement groove configured to receive the substrate edge, the placement groove being surrounded by the first cover portion, the second cover portion, and the third cover portion. The substrate support includes a rotating support portion configured to rotate the substrate along a rotation axis in a horizontal plane.

According to another aspect, there is provided a substrate processing apparatus including a cleaning apparatus for cleaning a substrate, a substrate support for supporting the substrate in a horizontal state, and a spray apparatus for spraying a spray liquid on the substrate. The cleaning apparatus includes a nozzle configured to spray a cleaning liquid, a nozzle extension including a nozzle extension body having a first aperture at a first end coupled to the nozzle and a second aperture at a second end, the first aperture and the second aperture connected by a fluid passage in the nozzle extension body, the first aperture aligned with the nozzle and the second aperture for discharging the cleaning liquid, and the first aperture and the second aperture each have a normal direction oblique to each other, and a cover that encloses the second aperture to receive the cleaning liquid from the second aperture, and that includes a first cover configured to cover at least a portion of a front surface of a substrate adjacent to a substrate edge, a second cover portion configured to cover at least a portion of a rear surface of the substrate adjacent to the substrate edge, which is an opposite side of the front surface, and a third cover portion configured to cover at least a portion of a side surface of the substrate edge connecting between the front surface and the rear surface, and a discharge extension that is connected to the cover and that includes a discharge path through which the cleaning liquid may pass. The nozzle includes an inner wall defining a cleaning liquid path through which the cleaning liquid may pass and an exterior wall surrounding the inner wall. The inner wall further includes an internal nozzle that communicates the cleaning liquid path with an outlet of the internal nozzle for ejecting the cleaning liquid. A space is provided between the exterior wall and the inner wall and the space between the exterior wall and the inner wall is configured to pass a gas therethrough and the interior nozzle is configured to cause a gas leaving the space to contact the cleaning liquid that is ejected from the outlet. The nozzle extension body comprises a flow changing portion configured to change a flow direction of the cleaning liquid passing therethrough. The first cover has a first cover hole formed therein, the second cover portion has a second cover hole formed therein, and the cover is configured to pass the cleaning liquid through the first cover hole and the second cover hole. The cover includes a placement groove configured to receive the substrate edge, the placement groove being surrounded by the first cover, the second cover portion and the third cover portion. The discharge extension has an inclined structure to guide the cleaning liquid to pass through a lower side of the third cover portion based on a vertical direction of the front surface of the substrate. The substrate support includes a rotating support portion configured to rotate the substrate about a rotation axis in a horizontal plane.

Additional aspects of example embodiments will be set forth in part in the description which follows and, in part, will be apparent from the description.

According to example embodiments, it is possible to prevent impurities being scattered onto a substrate during substrate processing with a cleaning apparatus and a substrate processing apparatus.

The technical benefits achieved by the present example embodiments are not limited to those described above, and other technical benefits may be inferred from the following example embodiments by those skilled in the art.

BRIEF DESCRIPTION OF THE FIGURES

These and/or other aspects, features, and advantages of the invention will become apparent and more readily appreciated from the following description of example embodiments, taken in conjunction with the accompanying drawings of which.

DETAILED DESCRIPTION

Figure 1:
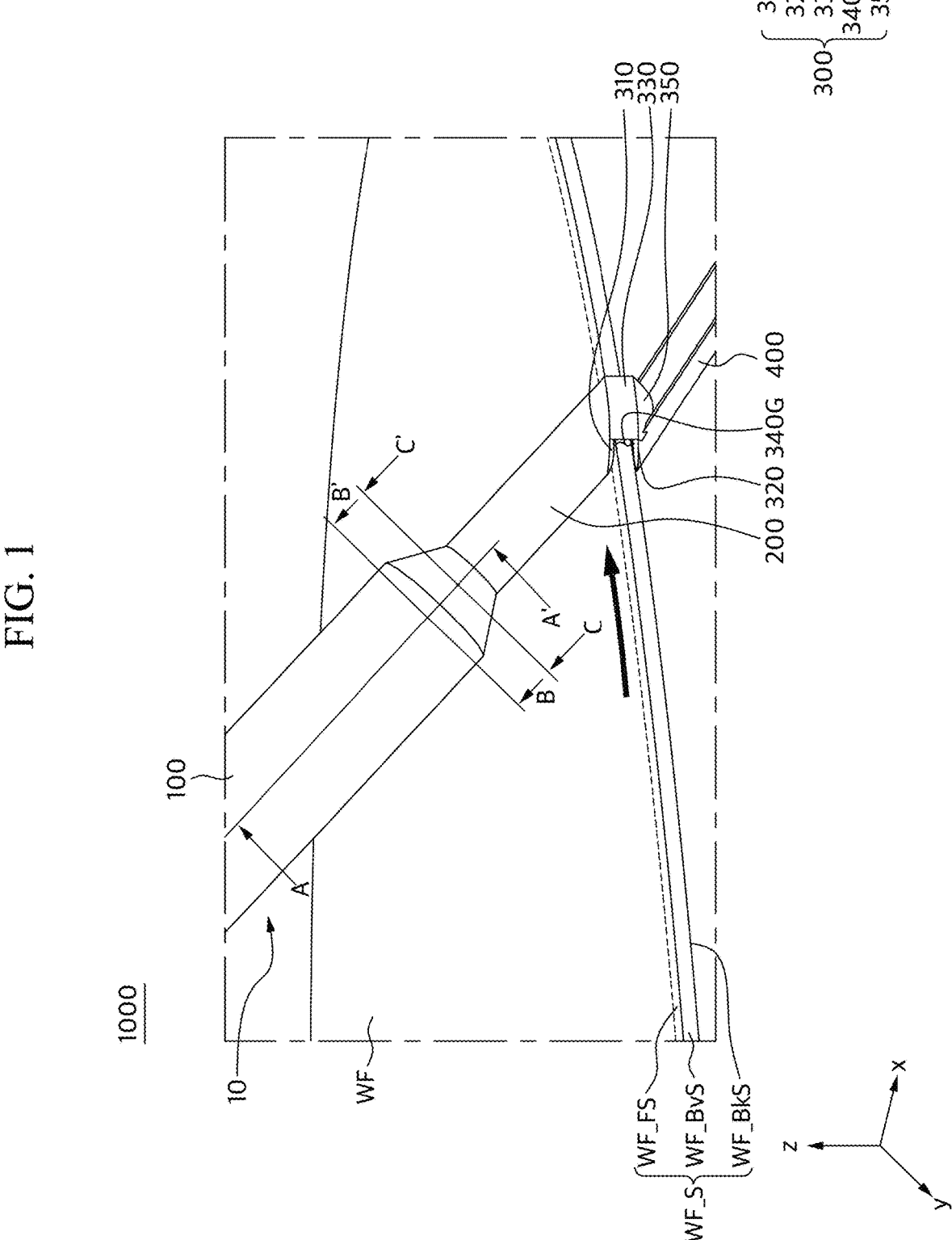
FIG. 1 illustrates a cleaning apparatus and a substrate processing apparatus according to an example embodiment.

The present disclosure now will be described more fully hereinafter with reference to the accompanying drawings, in which various embodiments are shown. The inventive concept may, however, be embodied in many different forms and should not be construed as limited to the example embodiments set forth herein. It should also be emphasized that the disclosure provides details of alternative examples, but such listing of alternatives is not exhaustive. Furthermore, any consistency of detail between various examples should not be interpreted as requiring such detail. The language of the claims should be referenced in determining the requirements of the invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein. Further, the terms or words should be interpreted with meaning and concept consistent with the technical idea of the present disclosure based on the principle that the inventor may appropriately define the concept of terms in order to explain his or her invention in the best way.

The same reference numeral or sign shown in each drawing attached to the specification may represent parts or components that perform the same or substantially the same function. For convenience of description and understanding, different embodiments may be described using the same reference numerals or symbols. In other words, even if a component or an element having the same reference numeral is shown in multiple drawings, the multiple drawings may not all represent one example embodiment and there may be variations between components having the same reference number.

In the present disclosure, when an element is described as being "on" or "adjacent to" another element, the element may be understood as being in contact with or connected to the other element, but it also may be understood that another intervening element may exist between the two.

Further, in the present disclosure, when an element is described as being "on top of" another element, it may be understood as existing above the vertical direction, for example, as being above the +z direction in the drawing, and the two elements may be in contact or directly connected, but it may also be understood that another intervening element may exist between the two. The same is applied when an element is described as being "above" another element in the present disclosure.

Further, in the present disclosure, when an element is described as being "underneath" another element, it may be understood as existing below based on the vertical direction, for example, being further below based on the −z direction in the drawing, and the two elements may be in contact or directly connected, but it may also be understood that another intervening element may exist between the two. The same is applied when an element is described as being "beneath" another element.

Further, in the present disclosure, when an element is described as being "directly on," "immediately adjacent to" or "in contact with" another element, it may be understood that there is no other element intervening between the two elements. Other similar expressions describing the positional relationship between elements can also be interpreted similarly as above.

In the following description, singular expressions include plural expressions unless the context clearly dictates otherwise.

It will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. As used herein, items described as being "fluidly connected" or in "fluid communication" are configured such that a liquid or gas can flow, or be passed, from one item to the other.

The terms "comprising," "comprises," "have," "may have," "include," and "may include" as used herein indicate the presence of stated features (for example, elements such as numerical values, functions, operations, or parts), and do not preclude the presence or addition of additional features.

Further, in the following description, expressions such as an upper side, top, a lower side, bottom, a side, front and a back side are expressed based on the direction shown in the drawing. If the direction of the object changes, it may be expressed differently.

Further, in the specification and claims, terms including ordinal numbers such as "first," "second," etc. may be used to distinguish between components or elements. These ordinal numbers are used to distinguish identical or similar components from each other, and the meaning of the terms should not be interpreted limitedly due to the use of such ordinal numbers. For example, components or elements combined with these ordinal numbers should not be interpreted as having a limited order of use or arrangement based on the number. If necessary, each ordinal number may be used interchangeably. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The drawings illustrated in the present disclosure are according to mere example embodiments, and the ratio of the width, the length, and the height (or the thickness) of each element may be exaggerated for detailed descriptions for the example embodiments, and thus the relative size of elements as shown may differ from reality. Further, in the coordinate system illustrated in the drawings, each axis may be perpendicular to each other, and the direction the arrow points may be the + direction, and the direction opposite to the direction indicated by the arrow (rotated by 180 degrees) may be the − direction.

Figure 2:
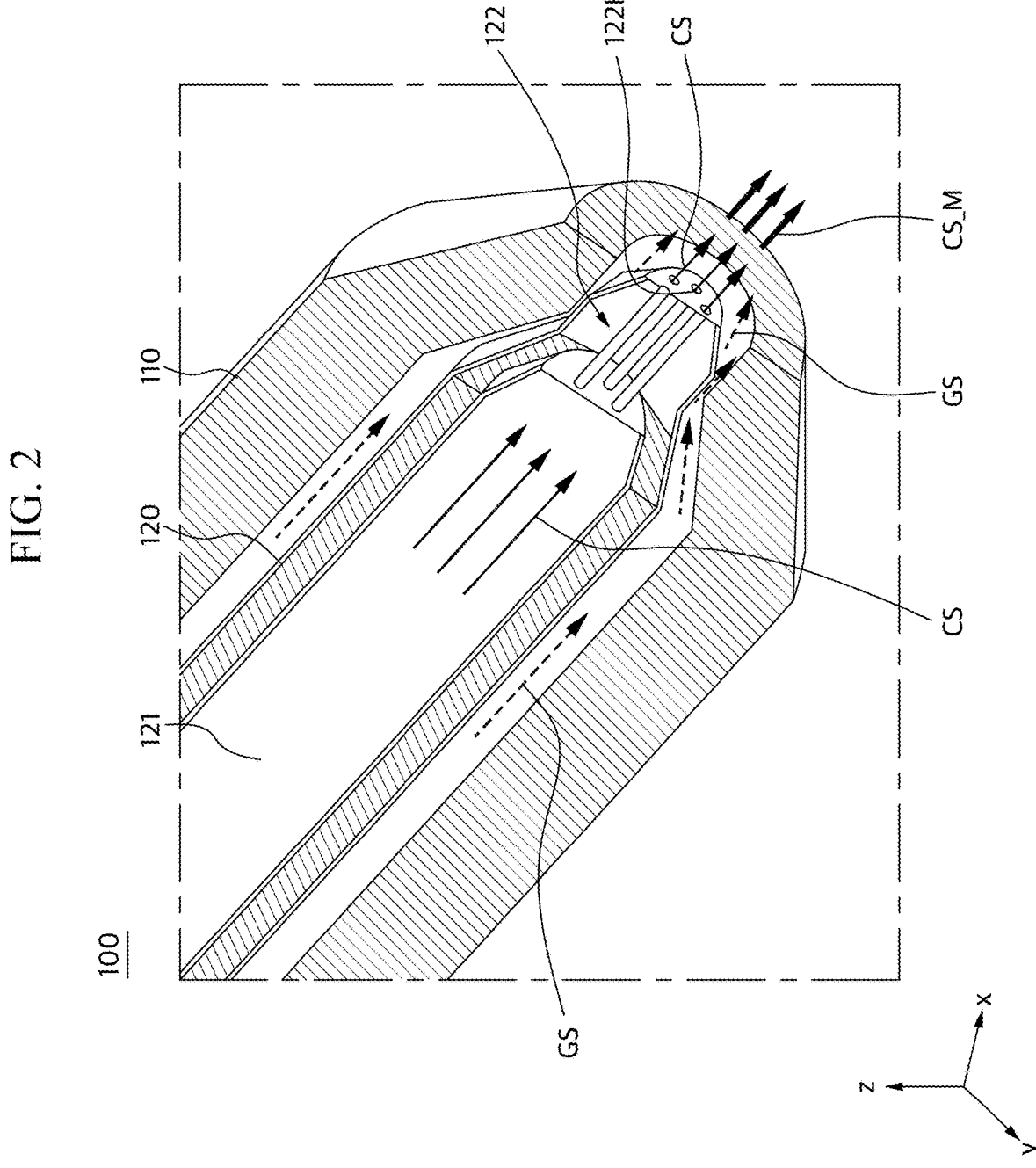
FIG. 2 illustrates a nozzle of a cleaning apparatus according to an example embodiment of the present disclosure, and is a cross-sectional view taken along line AA' of FIG. 1.
Figure 3:
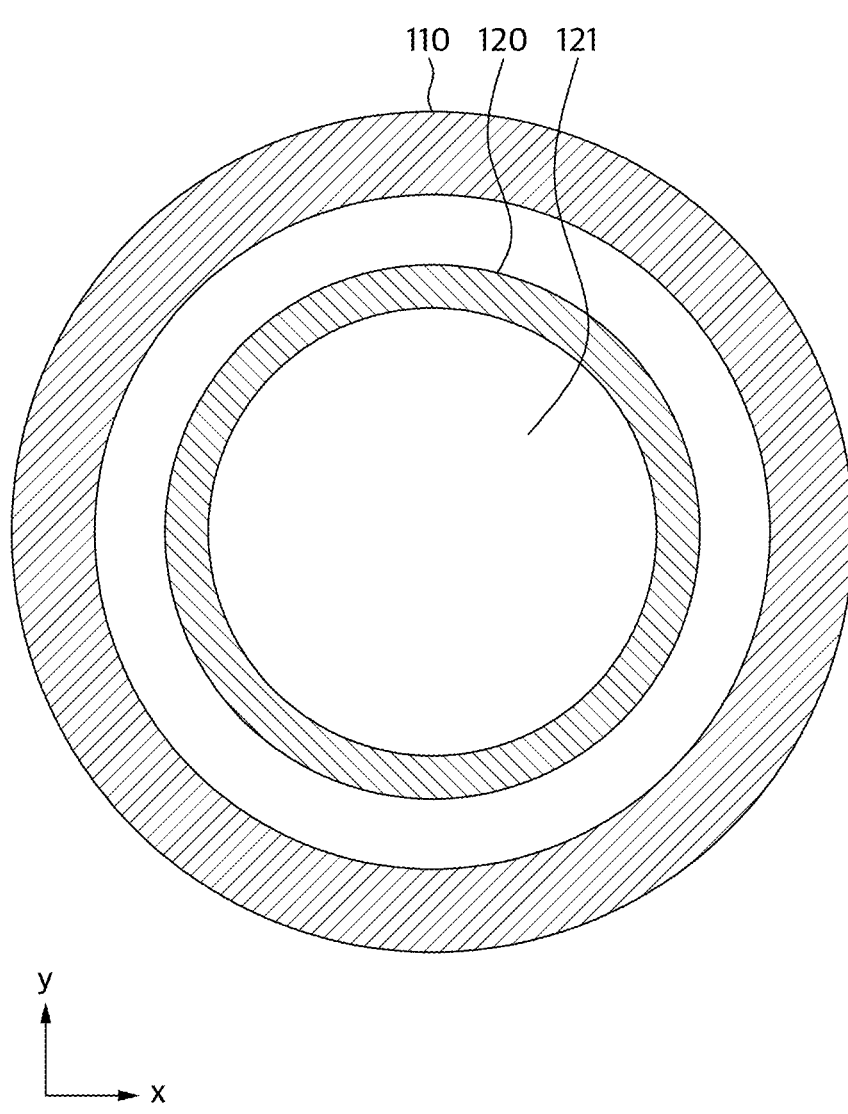
FIG. 3 illustrates a nozzle of a cleaning apparatus according to an example embodiment, and is a cross-sectional view taken along line BB' of FIG. 1.
Figure 4:
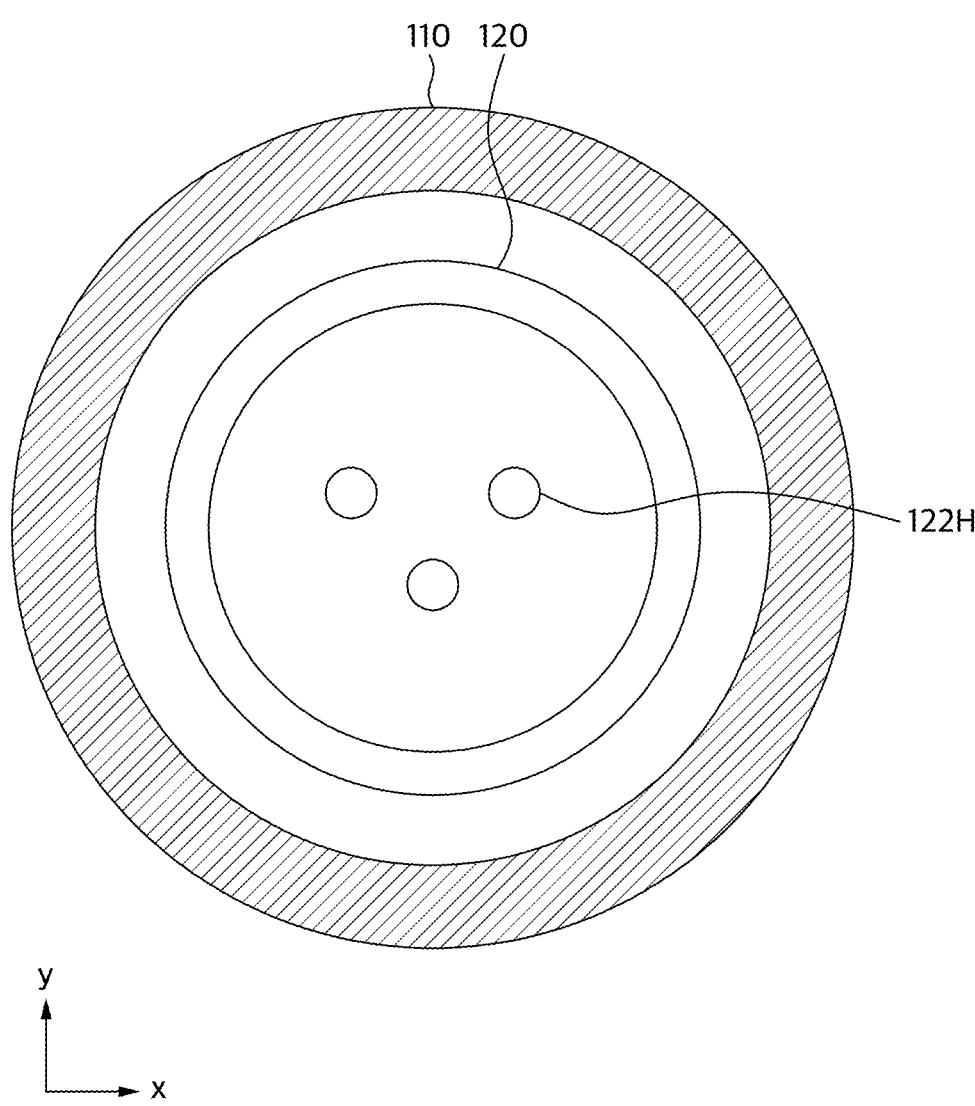
FIG. 4 illustrates a nozzle of a cleaning apparatus according to an example embodiment, and is a cross-sectional view taken along line CC' of FIG. 1.

FIG. 1 illustrates a cleaning apparatus 10 and a substrate processing apparatus 1000 according to an example embodiment. FIG. 2 illustrates a nozzle 100 of the cleaning apparatus 10 according to an example embodiment of the present disclosure, and is a cross-sectional view taken along line AA' of FIG. 1. FIG. 3 illustrates the nozzle 100 of the cleaning apparatus 10 according to an example embodiment, and is a cross-sectional view taken along line BB' of FIG. 1. FIG. 4 illustrates the nozzle 100 of the cleaning apparatus 10 according to an example embodiment, and is a cross-sectional view taken along line CC' of FIG. 1.

The cleaning apparatus 10 according to an example embodiment may include the nozzle 100 that sprays a cleaning liquid CS. The cleaning liquid CS may remove a thin film formed on a substrate WF from the substrate WF. For example, the cleaning liquid CS may etch away the thin film or wash away removed thin film pieces and discharge the thin film pieces to the outside (e.g., from the substrate WF).

The type of cleaning liquid CS is not particularly limited to these examples and may include any cleaning liquid used in the industry. The cleaning liquid CS may include one or more liquids selected from the group consisting of water, (pure water or deionized water), SC-1 (ammonia/peroxide mixture), SC-2 (hydrochloric acid/hydrogen peroxide mixture), hydrofluoric acid (ash hydrofluoric acid, and so on.), hydrogen peroxide, sulfuric acid, and nitric acid. Further, the thin film formed on the substrate WF may be, for example, a metal film, an oxide film, a silicon film, or a nitride film. The type of cleaning liquid CS may be appropriately selected based on the type of thin film formed on the substrate WF. The cleaning liquid CS may be a liquid at normal pressure and room temperature.

In the present disclosure, room temperature may indicate the natural temperature without any special addition or subtraction, or without any manipulation, although the room temperature may be climate controlled to be different from the ambient temperature. For example, the room temperature may be 0° C. to 35° C., 5° C. to 30° C., or 15° C. to 25° C., and may indicate a temperature of approximately 25° C. In the present disclosure, normal pressure may indicate the natural pressure without any special addition or subtraction. For example, the normal pressure may be 0.8 atm to 1.2 atm or 0.9 atm to 1.1 atm, and may indicate atmospheric pressure of approximately 1 atm.

According to an example embodiment, the cleaning apparatus 10 may remove the thin film formed on a substrate edge WF_S and/or wash away the removed thin film pieces. The substrate edge WF_S may refer to a portion of the substrate WF immediately adjacent the edge of the substrate WF including a side surface and a portion of the substrate WF extending towards the center of the substrate WF. For example, the substrate edge WF_S may include a side or lateral surface of the substrate WF, a portion of the top or front surface of the substrate WF, and a portion of the bottom or rear portion of the substrate WF. The portion extending towards the center of the substrate WF may extend a distance less than or equal to the thickness of the substrate WF. In other examples, the substrate edge WF_S may include a larger portion of the substrate WF such as twice the thickness of the substrate WF. The substrate edge WF_S may include a portion of the front surface part WF_FS (i.e., the front surface of the substrate WF) and a portion of the rear surface part WF_BkS (i.e., the rear surface of the substrate WF) that is the opposite side of the front surface part WF_FS. The front surface part WF_FS is the part of the substrate WF where a so-called thin film is formed, where a circuit can be formed later. The substrate edge WF_S may further include a side surface part WF_BvS (i.e., the side surface of the substrate WF) that connects the front surface part WF_FS and the rear surface part WF_BkS. As described above, the substrate treatment process includes forming at least one thin film. The thin film is mainly formed on the front surface part WF_FS, but a portion of the thin film may also be formed on the side surface part WF_BvS or the rear surface part WF_BkS.

Specifically, according to an example embodiment, the cleaning apparatus 10 may remove at least a portion of the thin film formed on the front surface part WF_FS, the rear surface part WF_BkS, and the side surface part WF_BvS of the substrate edge WF_S, and may wash away the removed thin film pieces.

According to an example embodiment, the nozzle 100 may include an inner wall 120 defining a cleaning liquid path 121 that provides a channel for the cleaning liquid CS to pass through, and an exterior wall 110 surrounding the inner wall 120. For example, the inner wall 120 may be a tube structure having an inner lumen corresponding to the cleaning liquid path 121. Each of the inner wall 120 and the exterior wall 110 may include one or more layers of material. Each of the inner wall 120 and the exterior wall 110 may have a particular thickness with have an inner surface and an outer surface. The cleaning liquid path 121 may be enclosed by the inner wall 120.

According to an example embodiment, the inner wall 120 may include an internal nozzle 122 providing fluid communication between the cleaning liquid path 121 and an outlet 122H from which the cleaning liquid CS may be ejected. The outlet 122H may be at an end of the internal nozzle 122.

According to an example embodiment, the cross-sectional area of the cleaning liquid path 121, which is perpendicular to the direction in which the cleaning liquid CS passes, may be larger than the cross-sectional area of the internal nozzle 122, which is perpendicular to the direction in which the cleaning liquid CS passes. Having the cross-sectional area of the cleaning liquid path 121 larger than that of the internal nozzle 122 may increase the velocity of the cleaning liquid CS as it passes through the internal nozzle 122.

According to an example embodiment, the cleaning liquid path 121 may have a constant cross-sectional area perpendicular to the direction in which the cleaning liquid CS passes. The constant cross-sectional area may stabilize the flow of the cleaning liquid CS as it passes through the cleaning liquid path.

According to an example embodiment, the cross-sectional area perpendicular to the direction in which the cleaning liquid CS passes of the cleaning liquid path 121 may gradually decrease toward the end of the cleaning liquid path 121. The end of the cleaning liquid path having a decreased cross-sectional area may be connected to the internal nozzle 122, and parts other than a part in communication with the internal nozzle 122 may be blocked (e.g., the internal nozzle 122 may be the only outlet of the cleaning liquid path 121). The cleaning liquid CS passing through the cleaning liquid path 121 may be ejected through the internal nozzle 122.

In an example embodiment, the pressing force of the cleaning liquid CS (e.g., the mass and velocity of the cleaning liquid CS) ejected through the outlet 122H may be determined depending on the specific design, such as the type of thin film formed on the substrate WF (e.g., the pressing force may be selected based on the thin film to be removed). For example, the pressing force may be about 0.1 MPa to 1 MPa or about 0.1 MPa to 0.5 MPa. The cleaning liquid CS may be selected depending on the specific design, such as the type of thin film formed on the substrate WF. The cleaning liquid CS may have a temperature above room temperature, above 60° C., above 80° C., or above 120° C. The cleaning liquid CS may have a temperature below the upper temperature limit of its liquid state, taking pressure into account. The high temperature and high pressure cleaning liquid CS may improve the cleaning effect.

According to an example embodiment, the exterior wall 110 and the inner wall 120 may include a space between them. The space between the exterior wall 110 and the inner wall 120 may be open, and gas GS may pass through the space. In other words, the space between the exterior wall 110 and the inner wall 120 may be arranged to allow the gas GS to pass through. The gas GS may come into contact with the cleaning liquid CS ejected from the outlet 122H. The cleaning liquid CS may become misted cleaning liquid CS_M as a result of the contact with the gas GS, and the misted cleaning liquid CS_M may be more effective in removing a thin film formed on the edge of the substrate.

According to an example embodiment, the gas GS may be in a gas phase at normal pressure and room temperature. The gas GS is not particularly limited as long as no active chemical reaction is carried out with the cleaning liquid CS. For example, the gas GS may include one selected from the group consisting of dry air, wet air, and inert gas (nitrogen, helium, neon, argon and so on).

According to an example embodiment, the inner wall 120 may include a bent structure corresponding to a structure in which the cross-sectional area of the end of the cleaning liquid path 121 gradually decreases. Likewise, the exterior wall 110 may include a bent structure corresponding to the bent structure of the inner wall 120.

According to an example embodiment, the gap between the bent structure of the inner wall 120 and the bent structure of the exterior wall 110 may be formed to gradually decrease. Through the bent structure the cross section of the space may be reduced increasing the velocity of the gas GS. Through the increased velocity of the gas GS the mistization of the cleaning liquid CS may be performed more advantageously.

According to an example embodiment, the pressure of the gas GS in contact with the cleaning liquid CS ejected from the outlet 122H may be greater than the pressure of the cleaning liquid CS ejected from the outlet 122H. The pressure of the gas GS may be at least 10 kPa higher than the pressure of the cleaning liquid CS ejected from the outlet 122H. Through this, mistization of the cleaning liquid CS may be performed more advantageously, and the cleaning liquid CS may be sprayed in a concentrated manner.

According to an example embodiment, the cleaning liquid CS may become the misted cleaning liquid CS_M in the form of a high-pressure mist due to the surrounding gas GS. Here, if the gas GS with higher pressure is not supplied around the cleaning liquid CS, since the cleaning liquid CS scatters, it may be difficult to concentrate and spray the cleaning liquid CS into the target area.

Figure 5:
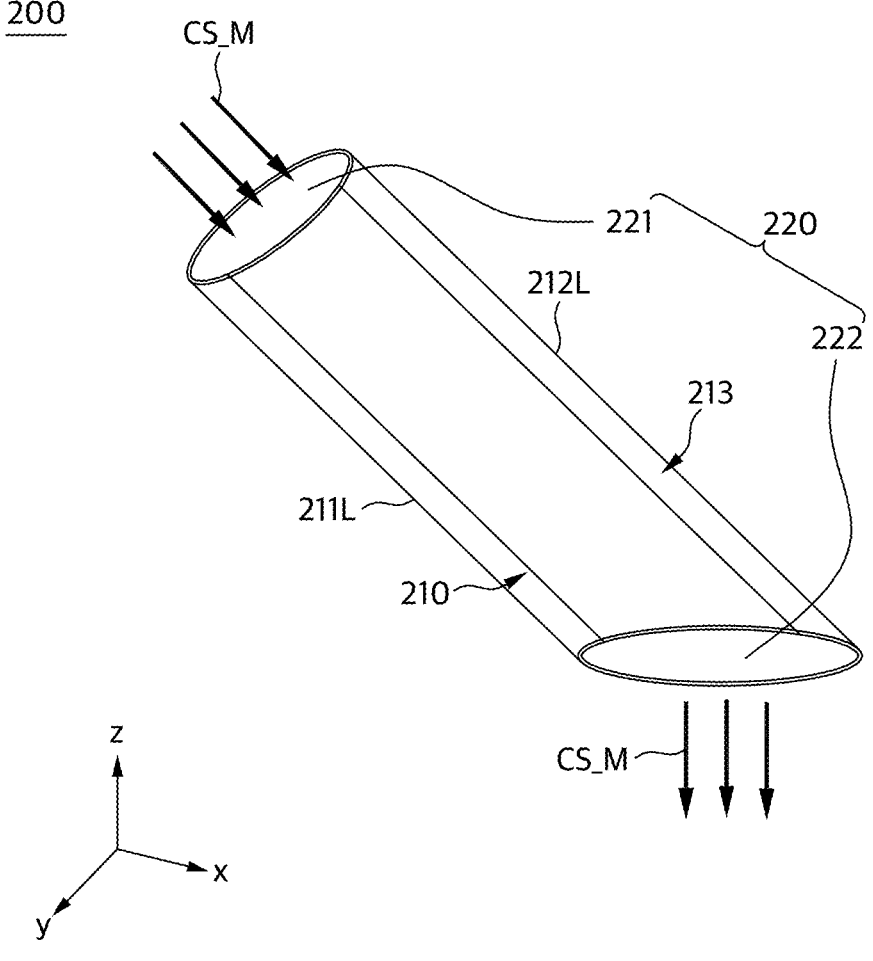
FIG. 5 illustrates an extension part of a cleaning apparatus according to an example embodiment.

FIG. 5 illustrates an extension part 200 of the cleaning apparatus 10 according to an example embodiment.

According to an example embodiment, the cleaning apparatus 10 may include an external part 210, which may be referred to as a nozzle extension body, and the extension part 200 may include extended opening surfaces 220, which may be apertures, disposed at opposing ends of the external part 210. The extension part 200 may be connected to the nozzle 100. The extension part 200 may receive the misted cleaning liquid CS_M from the nozzle 100. Specifically, the extension part 200 may receive the misted cleaning liquid CS_M from the nozzle 100.

In the present disclosure, the cleaning liquid CS may be used as a term that encompasses cleaning liquid supplied and discharged to remove thin films or impurities formed on the substrate WF. In other words, the cleaning liquid CS may encompass the concepts of the cleaning liquid CS passing through the cleaning liquid path 121, as well as the misted cleaning liquid CS_M and cleaning liquid CS_C after the cleaning depicted in FIG. 16, which will be described later.

According to an example embodiment, the extension part 200 may include a first extended opening surface 221, which may be referred to as a first aperture, that receives the misted cleaning liquid CS_M from the nozzle 100 and a second extended opening surface 222, which may be referred to a second aperture, that discharges the misted cleaning liquid CS_M. The first extended opening surface 221 and the second extended opening surface 222 may be placed at opposite ends of the external part 210, respectively.

According to an example embodiment, with respect to the extension part 200, the first extended opening surface 221 and the second extended opening surface 222 may not be parallel to each other (e.g., a normal line of a place of the first extended opening surface 221 may be oblique to a normal line of a plane of the second extended opening surface 222). In the extension part 200, the inflow direction of the misted cleaning liquid CS_M supplied to the first extended opening surface 221 and the discharge direction of the misted cleaning liquid CS_M discharged to the second extended opening surface 222 may intersect.

According to an example embodiment, the external part 210 may include a flow changing part 213, which may be referred to as a flow changing portion, that changes the flow direction of the introduced misted cleaning liquid CS_M. The flow changing part 213 may change the flow direction so that the misted cleaning liquid CS_M is directed to the substrate edge WF_S. By ensuring that the first extended opening surface 221, through which the misted cleaning liquid CS_M is introduced, and the second extended opening surface 222, through which the misted cleaning liquid CS_M is discharged, are not parallel to each other, the flow direction of the incoming misted cleaning liquid CS_M may be changed.

According to an example embodiment, the external part 210 may have differing lengths of lateral surface. For example, the external part 210 may have the form of a cylinder with a first end having a perpendicular face and a second end having an oblique face. For example, a first lateral length defined by a first reference line 211L which is a straight line connecting the first extended opening surface 221 and the second extended opening surface 222 in the shortest distance, and a second lateral length defined by a second reference line 212L which is a straight line longer than the first reference line 211L. Through the difference in lengths along the first reference line 211L and the second reference line 212L, the flow changing part 213 may be implemented. The flow changing part 213 may include a portion of the external part 210 between the end of the first reference line 211L and the end of the second reference line 212L. According to an example embodiment, the extension part 200 may be integrated with the nozzle 100.

Figure 6:
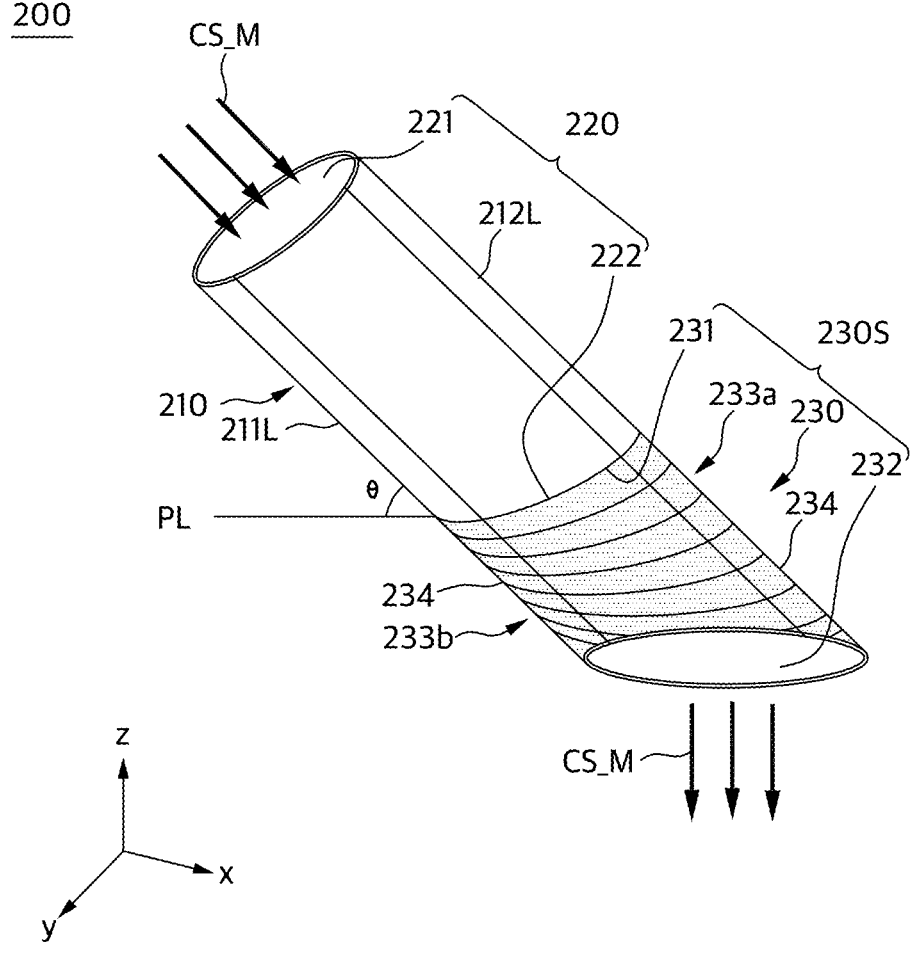
FIGS. 6 and 7 illustrate an extension part of a cleaning apparatus according to another example embodiment.
Figure 7:
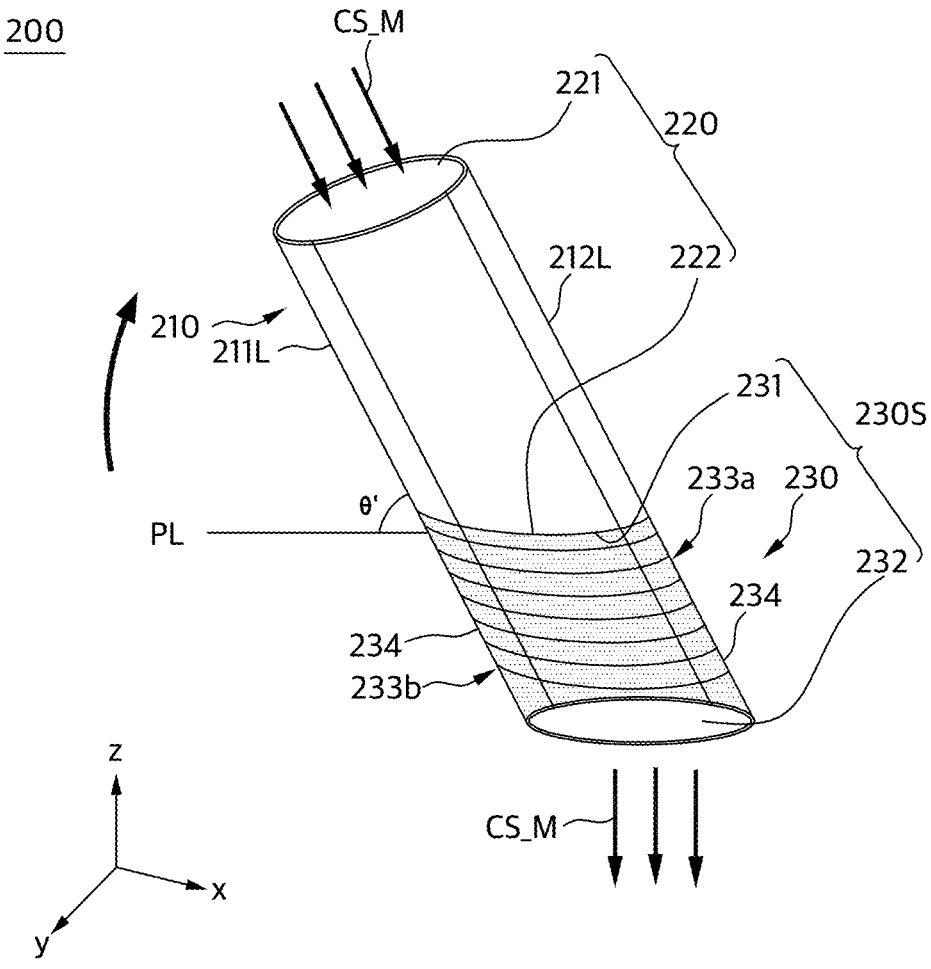

FIGS. 6 and 7 illustrate the extension part 200 of the cleaning apparatus 10 according to another example embodiment.

According to another example embodiment, the extension part 200 may include a flexible part 230, which may be a flexible portion, that flexes to change angle Θ between the first reference line 211L and the plane of the second extended opening surface 222.

According to another example embodiment, the external part 210 may be connected to the flexible part 230. In an example embodiment, the external part 210 may be connected while being inserted into the flexible part 230. In another example embodiment, surfaces of the external part 210 and the flexible part 230 may be connected through a connecting means such as adhesive. In another example embodiment, the external part 210 and the flexible part 230 may be connected through a coupling means such as a bolt or nut, and a separate connecting material may be connected to the external part 210 and the flexible part 230 through a coupling means, so that the external part 210 and the flexible part 230 may be connected. Meanwhile, in the present disclosure, the connection between the external part 210 and the flexible part 230 may be done using the above-described connecting elements or coupling means.

According to another example embodiment, the flexible part 230 may include flexible opening surfaces 230S, which may be apertures, disposed at both ends. The flexible opening surface 230S is connected to the external part 210 and may include a first flexible opening surface 231, which may be a first flexible aperture, through which the misted cleaning liquid CS_M flows in and a second flexible opening surface 232, which may be a second flexible aperture, through which the misted cleaning liquid CS_M is discharged. The first flexible opening surface 231 and the second extended opening surface 222 may be in fluid communication with each other through a fluid passage in the flexible part 230, and through this, the external part 210 and the flexible part 230 may be fluidly connected.

According to another example embodiment, the flexible part 230 may include a wrinkle structure 234 (e.g., a corrugated structure). The wrinkle structure 234 may allow the external part 210 connected to the flexible part 230 to move. The misted cleaning liquid CS_M supplied at the first extended opening surface 221 may be supplied according to a specific angle. The angle at which the misted cleaning liquid CS_M is supplied may be equal to the angle Q between the first reference line 211L and the plane at the same level as the second extended opening surface 222 based on the vertical direction of the second extended opening surface 222. Specifically, the angle at which the misted cleaning liquid CS_M is supplied may be equal to the angle Θ between the first reference line 211L and a line PL that touches the first reference line 211L among planes that are coplanar with the second extended opening surface 222 based on the vertical direction of the second extended opening surface 222. Moving the external part 210 may cause the angle at which the misted cleaning liquid CS_M is supplied to change.

FIGS. 6 and 7 are intended to illustrate the principle by which the wrinkle structure 234 allows the external part 210 to change the angle at which the misted cleaning liquid CS_M is supplied. Referring to FIG. 6, the flexible part 230 may include a first flexible part 233*a* and a second flexible part 233*b*, each including the wrinkle structure 234, and based on the vertical direction of the second extended opening surface 222, in order for the angle Θ between the plane at the same level as the second extended opening surface 222 and the first reference line 211L to be maintained, the second flexible part 233*b* may be folded to form the wrinkle structure 234 more densely than the first flexible part 233*a* (e.g., the wrinkle structure may bend). Referring to FIG. 7, as the second flexible part 233*b* unfolds and the first flexible part 233*a* folds, the wrinkle structure 234 of the first flexible part 233*a* may be formed more densely than what is illustrated in in FIG. 6. Through this, compared to FIG. 6, based on the vertical direction of the second extended opening surface 222, angle Q' between the plane at the same level as the second extended opening surface 222 and the first reference line 211L may be larger.

Figure 8:
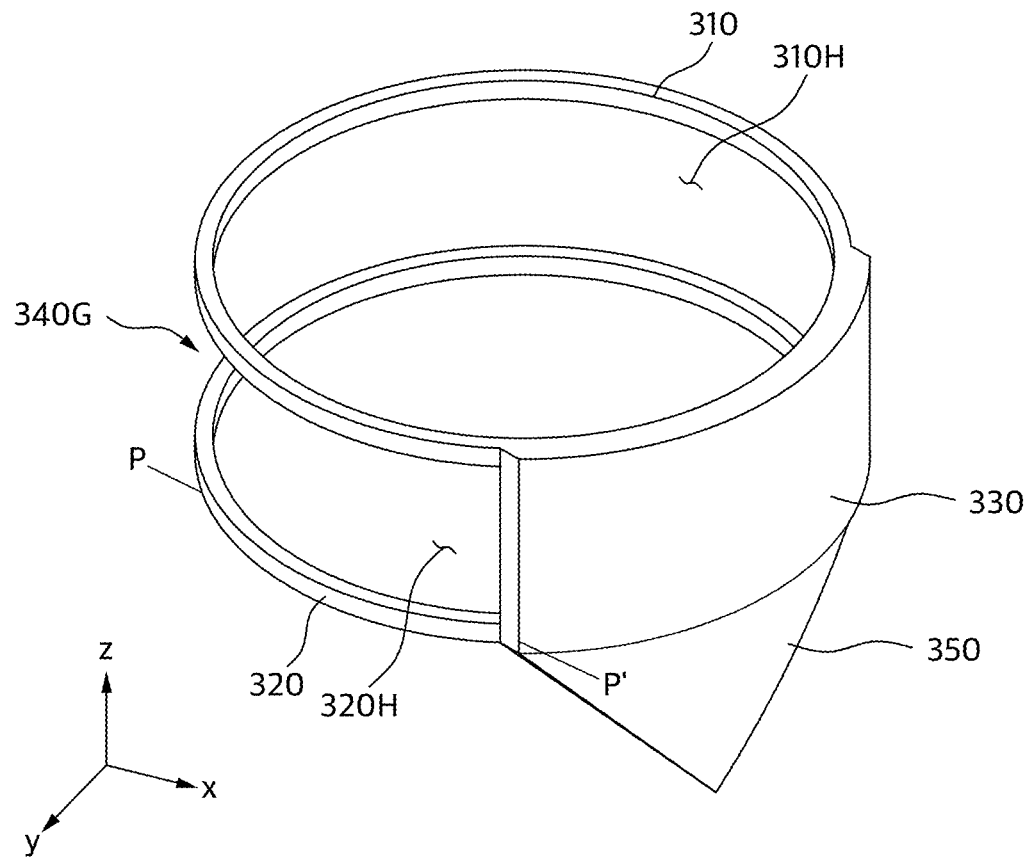
FIG. 8 illustrates a cover part of a cleaning apparatus according to an example embodiment.
Figure 9:
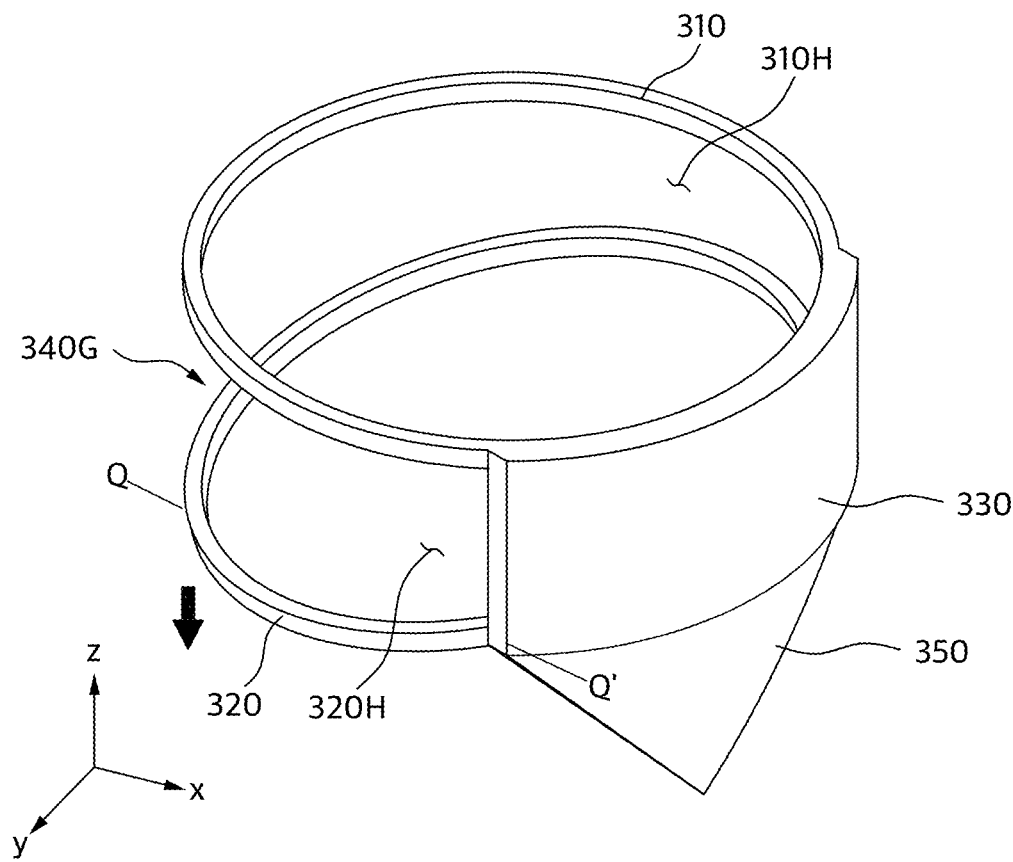
FIG. 9 illustrates a cover part of a cleaning apparatus according to another example embodiment.
Figure 10:
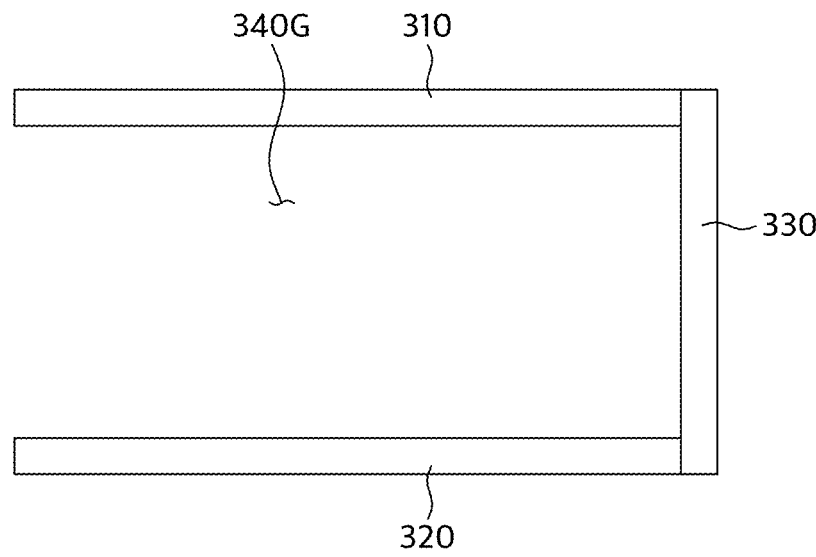
FIG. 10 is a cross-sectional view of the cover part of FIG. 8 cut along line PP'.
Figure 11:
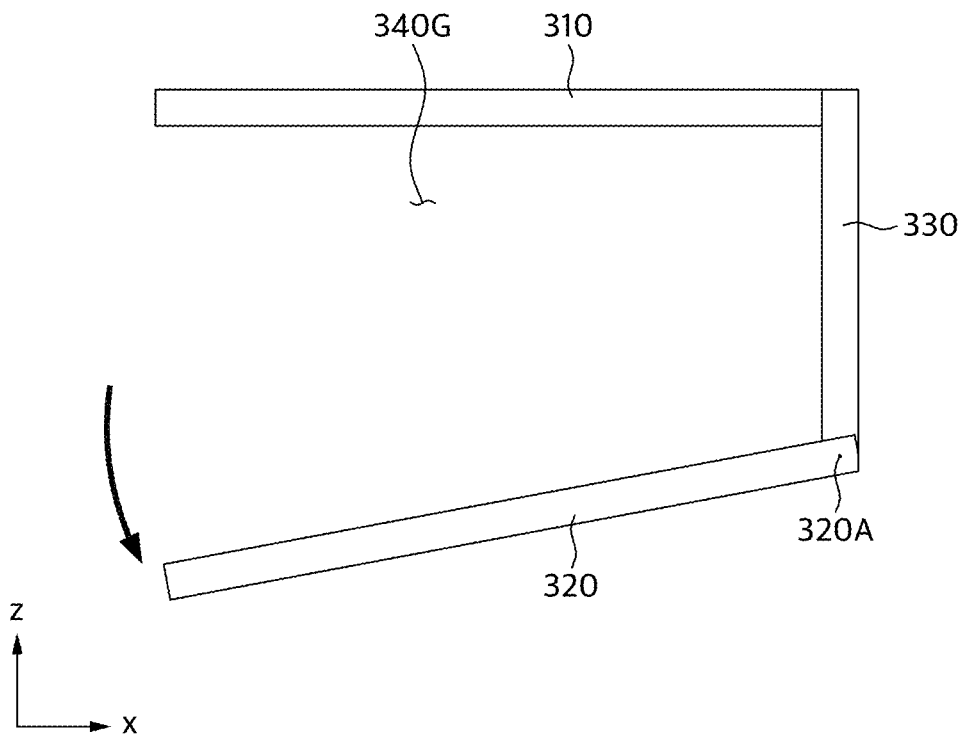
FIG. 11 is a cross-sectional view of the cover part of FIG. 9 cut along line QQ'.

Each of FIGS. 8 and 9 illustrates a cover part 300 of the cleaning apparatus 10 according to an example embodiment. FIG. 10 is a cross-sectional view of the cover part 300 of FIG. 8 cut along line PP'. FIG. 11 is a cross-sectional view of the cover part 300 of FIG. 9 cut along line QQ'.

According to an example embodiment, the cleaning apparatus 10 may include the cover part 300 that covers at least a portion of each of the front surface part WF_FS, the rear surface part WF_BkS, and the side surface part WF_BvS of the substrate edge WF_S. The cover part 300 may be connected to the extension part 200. The cover part 300 may receive the misted cleaning liquid CS_M from the extension part 200. Specifically, the cover part 300 may receive the misted cleaning liquid CS_M from the extension part 200. Further, the misted cleaning liquid CS_M may be sprayed only onto the substrate edge WF_S by the cover part 300.

According to an example embodiment, the cover part 300 may include a first cover part 310, which may be referred to as a first cover portion, that covers at least a portion of the front surface part WF_FS of the substrate edge WF_S, a second cover part 320, which may be referred to as a second cover portion, that covers at least a portion of the rear surface part WF_BkS which is the opposite side of the front surface part WF_FS of the substrate edge WF_S, and a third cover part 330, which may be referred to as a third cover portion, and which covers at least part of the side surface part WF_BvS that connects the front surface part WF_FS and the rear surface part WF_BkS of the substrate edge WF_S.

According to an example embodiment, the cover part 300 may include a placement groove 340G that is formed between the first cover part 310, the second cover part 320, and the third cover part 330. The placement groove 340G may be configured to receive the substrate edge WF_S (e.g., may have a width sufficient for the substrate edge WF_S to placed therein). The substrate edge WF_S may be located in the placement groove 340G. By locating the substrate edge WF_S in the placement groove 340G that is formed between the first cover part 310, the second cover part 320 and the third cover part 330, the misted cleaning liquid CS_M sprayed on the substrate edge WF_S may not scatter onto the substrate WF together with impurities.

According to an example embodiment, based on the vertical direction (that is, the z-axis direction) of the front surface part WF_FS of the substrate edge WF_S, at least a portion of the first cover part 310 may overlap the front surface part WF_FS of the substrate edge WF_S. In an example embodiment, based on the vertical direction (that is, the z-axis direction) of the front surface part WF_FS of the substrate edge WF_S, a portion of the first cover part 310 may not overlap with the front surface part WF_FS of the substrate edge WF_S. A portion of the first cover hole 310H may be placed in a non-overlapping area.

According to an example embodiment, based on the vertical direction (that is, the z-axis direction) of the front surface part WF_FS of the substrate edge WF_S, at least a portion of the second cover part 320 may overlap the rear surface part WF_BkS of the substrate edge WF_S. In an example embodiment, based on the vertical direction (that is, the z-axis direction) of the front surface part WF_FS of the substrate edge WF_S, a portion of the second cover part 320 may not overlap the rear surface part WF_BkS of the substrate edge WF_S. A portion of the second cover hole 320H may be placed in a non-overlapping area.

According to an example embodiment, the first cover part 310 may include the first cover hole 310H. Further, the second cover part 320 may include the second cover hole 320H. Further, the misted cleaning liquid CS_M may pass through the first cover hole 310H and the second cover hole 320H. For example, the first cover part 310 may include the first cover hole 310H to allow the misted cleaning liquid CS_M to pass through, and the second cover part 320 may include the second cover hole 320H so that the misted cleaning liquid CS_M that passed through the first cover hole 310H may pass through.

According to an example embodiment, the third cover part 330 may be connected to a portion of the first cover part 310 and a portion of the second cover part 320. The third cover part 330 is not particularly limited, but may include a curved surface with a curvature substantially the same as the curvature of the side surface part WF_BvS of the substrate edge WF_S. Here, "a curvature substantially the same as the curvature" indicates that the ratio of the difference between the curvature of the side surface part WF_BvS and the curvature of a curved surface included in third cover part 330 compared to the curvature of side surface part WF_BvS of substrate edge WF_S is 10% or less than 10%.

According to an example embodiment, the third cover part 330 may cover the entire side surface part WF_BvS of the substrate edge WF_S placed in the placement groove 340G. Further, the height of the third cover part 330 (that is, the length along the z-axis direction) may be greater than the thickness of the side surface part WF_BvS of the substrate edge WF_S (that is, the length along the z-axis direction).

According to an example embodiment, some of the misted cleaning liquid CS_M supplied from the extension part 200 may contact the front surface part WF_FS of the substrate edge WF_S, and some of the misted cleaning liquid CS_M may be scattered by the second cover part 320 and the third cover part 330 and contact the rear surface part WF_BkS and the side surface part WF_BvS of the substrate edge WF_S. The supplied misted cleaning liquid CS_M is in the form of a high-pressure mist, and thus the misted cleaning liquid CS_M may reach the front surface part WF_FS, the rear surface part WF_BkS, and the side surface part WF_BvS of the substrate edge WF_S through the structure of the cover part 300, and the misted cleaning liquid CS_M may effectively remove the thin film.

Specifically, according to an example embodiment, without going through several processes through the structure of the cover part 300, the cleaning apparatus 10 may remove the thin film formed on the front surface part WF_FS, the rear surface part WF_BkS, and the side surface part WF_BvS of the substrate edge WF_S in a single process.

Referring to FIGS. 8 and 10, the first cover part 310 and the second cover part 320 may be parallel to each other and, the first cover part 310 and the second cover part 320 may face each other. Meanwhile, the planes formed by the first cover part 310 and the front surface part WF_FS of the substrate edge WF_S may face each other. Further, the planes formed by the second cover part 320 and the rear surface part WF_BkS of the substrate edge WF_S may face each other. A portion of the first cover part 310 may be connected to the third cover part 330.

Referring to FIGS. 9 and 11, the second cover part 320 may not be parallel to the plane formed by the rear surface part WF_BkS of the substrate edge WF_S (e.g., may be oblique). In other words, the second cover part 320 may have an inclined shape that is not parallel to the plane formed by the rear surface part WF_BkS. Further, the second cover part 320 may not face in line with the rear surface part WF_BkS of the substrate edge WF_S, and the second cover part 320 may have an inclined shape so that the misted cleaning liquid CS_M may more easily reach the rear surface part WF_BkS. A portion of the second cover part 320 may be connected to the third cover part 330. A point 320A where the second cover part 320 and the third cover part 330 are connected may be used as the fixed axis, and as the second cover part 320 rotates and moves in the −z-axis direction around the fixed axis, the second cover part 320 may have an inclined shape so that the misted cleaning liquid CS_M may more easily reach the rear surface part WF_BkS.

According to an example embodiment, the cover part 300 may include a part 350 covering scattered liquid, which may be referred to as an edge extension. The part 350 covering scattered liquid may be connected to the third cover part 330 and include an inclined surface slanted in the direction toward the placement groove 340G. The part 350 covering scattered liquid includes the inclined surface slanted in the direction toward the placement groove 340G, allowing the misted cleaning liquid CS_M to easily contact the substrate edge WF_S, or preventing the cleaning liquid CS_C after cleaning in FIG. 16 from scattering to the outside. Here, the cleaning liquid CS_C after cleaning in FIG. 16 relates to the cleaning liquid CS_C after cleaning in FIG. 16 discharged through the cover part 300, and the cleaning liquid CS_C after cleaning in FIG. 16 may include pieces of the thin film or impurities removed from the substrate WF, but is not limited thereto. Further, the cleaning liquid CS_C after cleaning in FIG. 16 may not be in a mist state.

Figure 12:
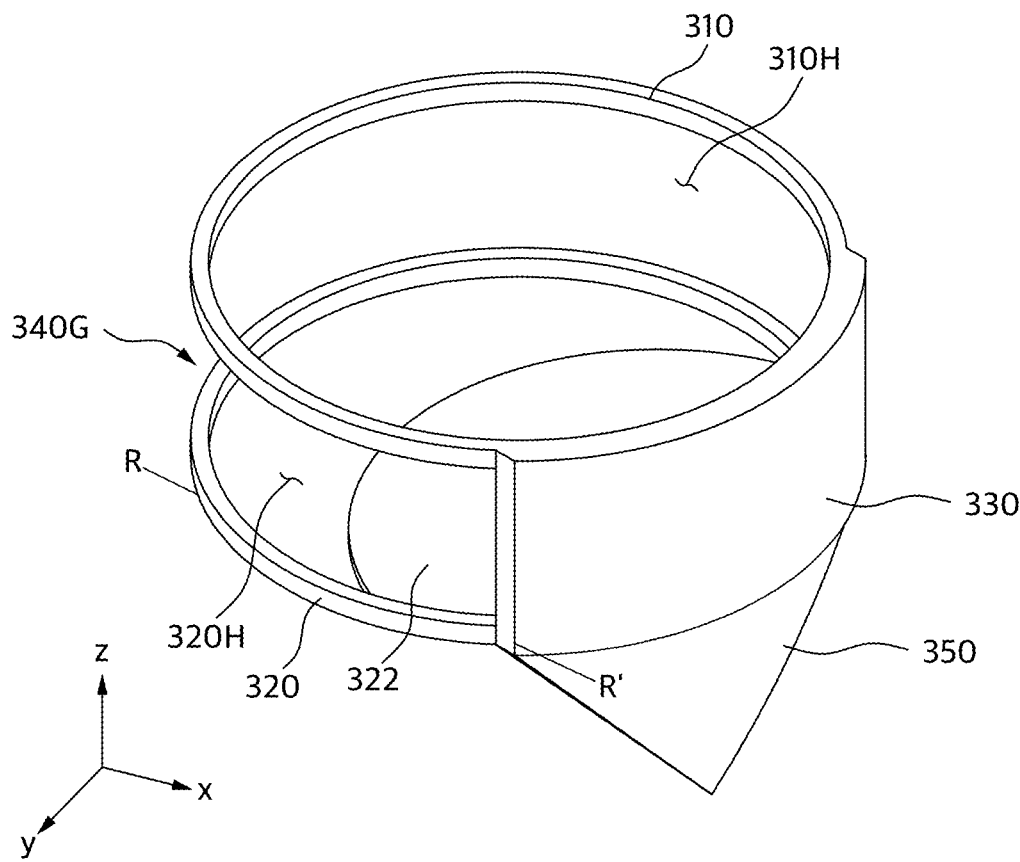
FIG. 12 is a diagram illustrating a part for scattering formed on the cover part of FIG. 8 according to an example embodiment.
Figure 13:
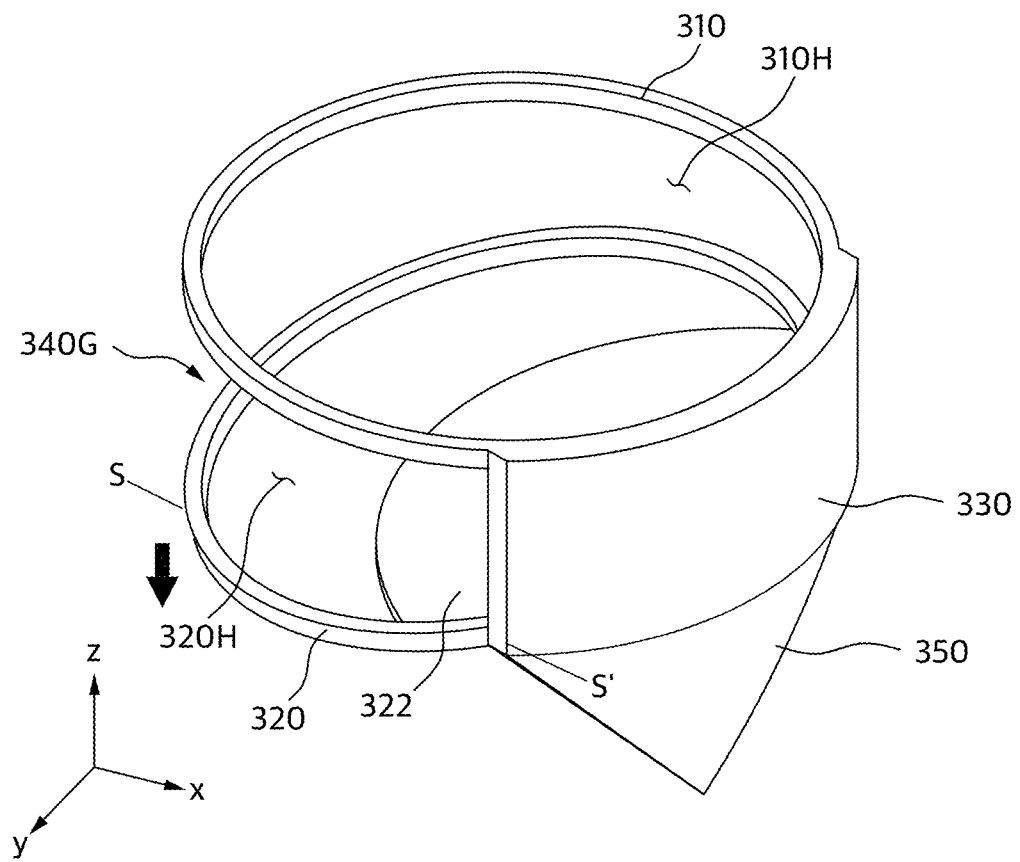
FIG. 13 is a diagram illustrating a part for scattering formed on the cover part of FIG. 9 according to another example embodiment.
Figure 14:
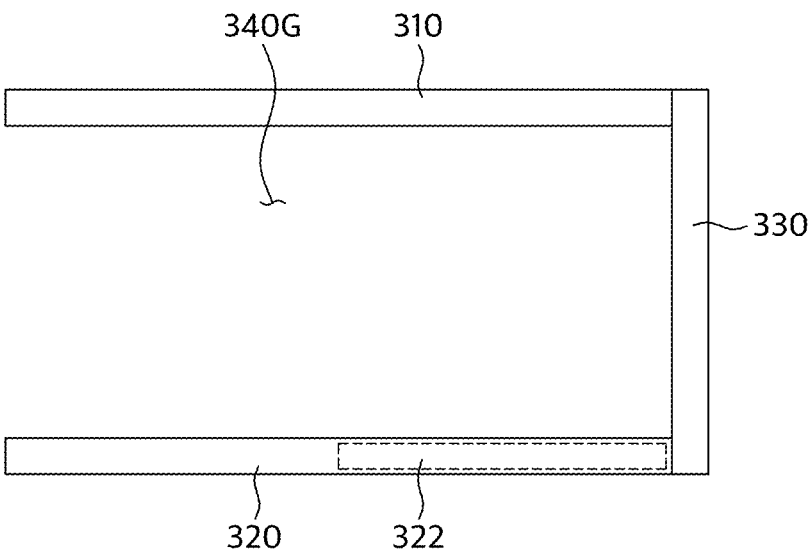
FIG. 14 is a cross-sectional view of the cover part of FIG. 12 cut along line RR'.
Figure 14:
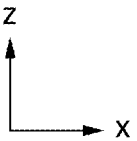
Figure 15:
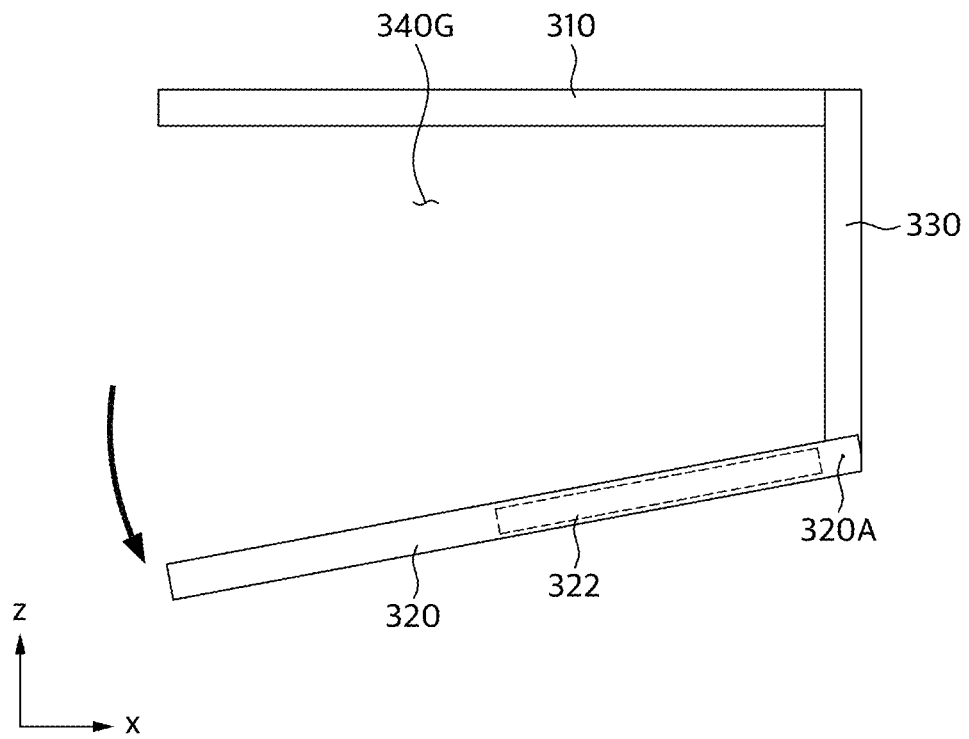
FIG. 15 is a cross-sectional view of the cover part of FIG. 13 cut along line SS'.

FIG. 12 is a diagram illustrating a part 322 for scattering formed on the cover part 300 of FIG. 8 according to an example embodiment. FIG. 13 is a diagram illustrating the part 322 for scattering formed on the cover part 300 of FIG. 9 according to another example embodiment. FIG. 14 is a cross-sectional view of the cover part 300 of FIG. 12 cut along line RR'. FIG. 15 is a cross-sectional view of the cover part 300 of FIG. 13 cut along line SS'.

Referring to FIGS. 12 and 13, the cover part 300 may include the part 322 for scattering, which may be referred to as a scattering portion, that blocks part of the second cover hole 320H. The part 322 for scattering may be formed adjacent to the third cover part 330. Through the part 322 for scattering, the misted cleaning liquid CS_M may more easily reach the rear surface part WF_BkS. Further, the part 322 for scattering does not completely block the second cover hole 320H, but only part of the second cover hole 320H, and thus the part 322 for scattering may be arranged so that the cleaning liquid CS_C after cleaning in FIG. 16 may be discharged to the externally.

According to an example embodiment, the part 322 for scattering may be connected to the second cover part 320 for structural stability. The part 322 for scattering may be connected to the second cover part 320 and may move as one with the second cover part 320. Referring to FIGS. 12 to 15, the plane formed by the part 322 for scattering and the second cover part 320 may be parallel to each other.

Meanwhile, referring to FIGS. 12 and 14, the plane formed by the part 322 for scattering may be parallel to the plane formed by the rear surface part WF_BKS of the substrate edge WF_S. In other words, the plane formed by the part 322 for scattering and the plane formed by the rear surface part WF_BkS of the substrate edge WF_S may face each other.

Referring to FIGS. 13 and 15, the plane formed by the part 322 for scattering may not be parallel to the plane formed by the rear surface part WF_BkS of the substrate edge WF_S. In other words, the plane formed by the part 322 for scattering may have an inclined shape that is not parallel to the plane formed by the rear surface part WF_BkS of the substrate edge WF_S. Having the point 320A where the second cover part 320 and the third cover part 330 are connected as the fixed axis, the second cover part 320 may have an inclined shape as it rotates and moves in the −z-axis direction based on the fixed axis, and thus the part 322 for scattering may allow the misted cleaning liquid CS_M to more easily reach the rear surface part WF_BkS.

Figure 16:
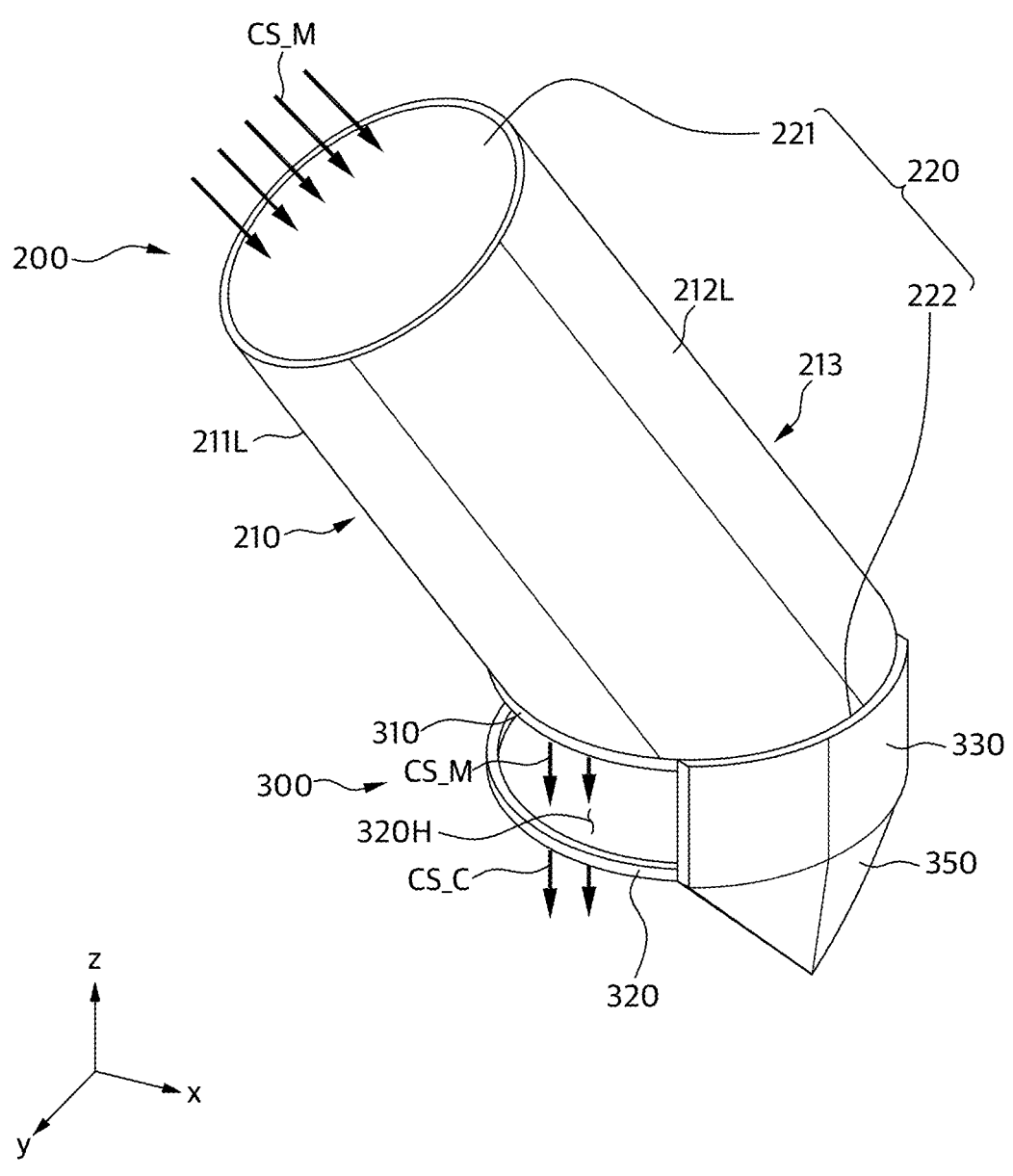
FIG. 16 illustrates an extension part and a cover part of a cleaning apparatus being combined according to an example embodiment.
Figure 17:
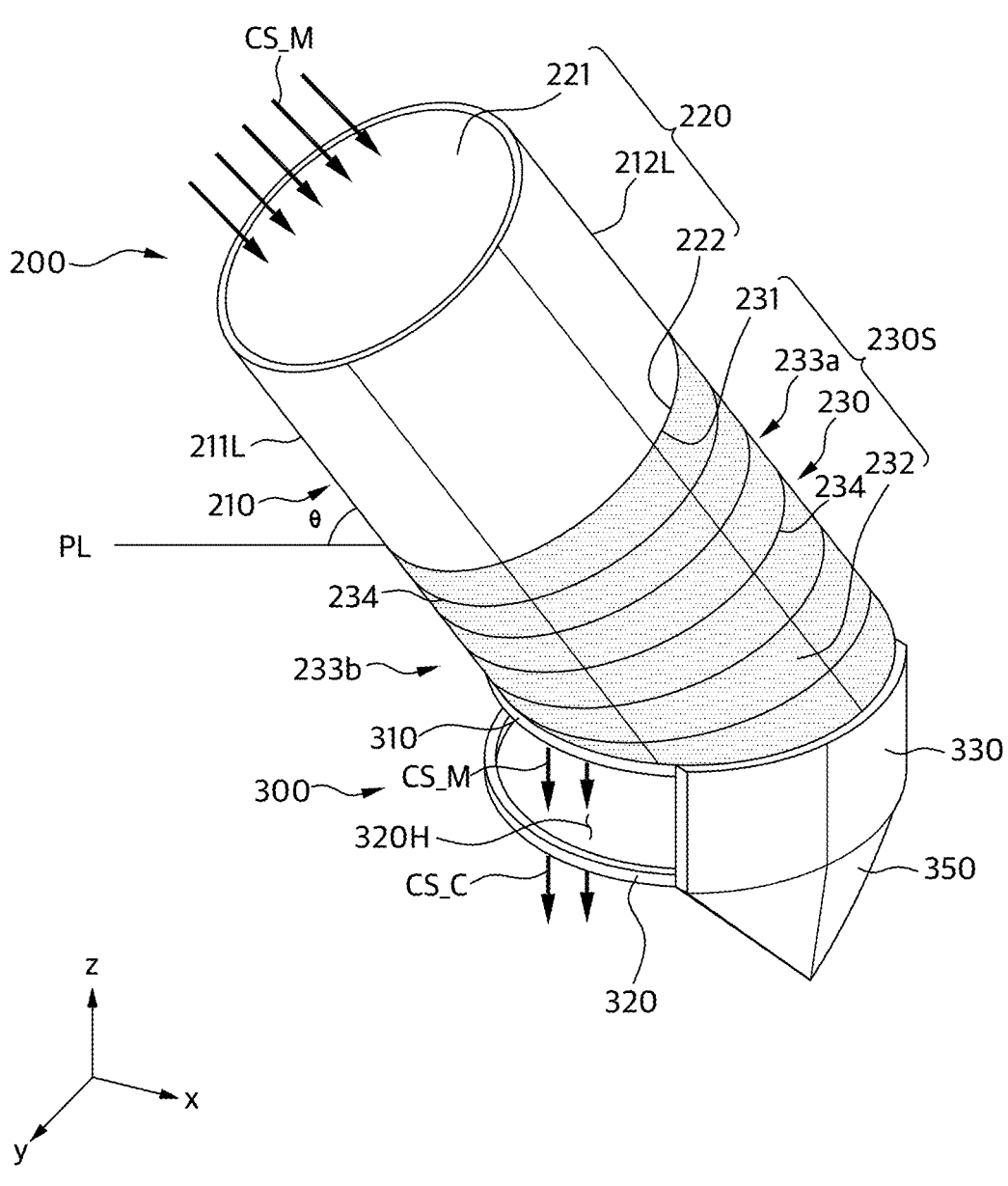
FIG. 17 illustrates an extension part and a cover part of a cleaning apparatus being combined according to an example embodiment.

Each of FIGS. 16 and 17 illustrates that the extension part 200 and the cover part 300 of the cleaning apparatus 10 being combined according to an example embodiment.

Referring to FIG. 16, the first cover part 310 may be in contact with the second extended opening surface 222 of the extension part 200, and the first cover part 310 may be in continuous contact around the second extended opening surface 222 in order for the misted cleaning liquid CS_M not to scatter to areas other than the substrate edge WF_S. The misted cleaning liquid CS_M that passes through the extension part 200 may pass through the first cover hole 310H of the first cover part 310, and may remove pieces of the thin film or impurities formed on the front surface part WF_FS of the substrate edge WF_S located in the placement groove 340G from the substrate WF and wash away the removed thin film pieces. Further, the misted cleaning liquid CS_M passing through the extension part 200 may collide with at least one of the second cover part 320 and the third cover part 330 after passing through the first cover hole 310H. Accordingly, as the misted cleaning liquid CS_M scatters within the cover part 300, thin film pieces or impurities formed on at least one of the side surface part WF_BvS and the rear surface part WF_BkS of the substrate edge WF_S located in the placement groove 340G may be removed from the substrate WF, and the misted cleaning liquid CS_M washes away the removed thin film pieces. Further, after the misted cleaning liquid CS_M, which passes through the extension part 200 and passes through the first cover hole 310H, without conflict with the third cover part 330, the misted cleaning liquid CS_M may remove thin film pieces or impurities formed on at least one of the side surface part WF_BvS and the rear surface part WF_BkS of the substrate edge WF_S located in the placement groove 340G from the substrate WF, and may wash away the removed thin film pieces. The cleaning liquid CS_C after cleaning may pass through the second cover hole 320H of the second cover part 320 and be discharged externally. Meanwhile, it is illustrated that the extension part 200 and the cover part 300 are separate elements, but it is only an example. The extension part 200 and the cover part 300 may be configured as one element.

Referring to FIG. 17, the extension part 200 may include the flexible part 230, and the second flexible opening surface 232 of the flexible part 230 and the first cover part 310 may come into contact. The second flexible opening surface 232 and the first cover part 310 may be contacted without any gaps in order for the misted cleaning liquid CS_M not to scatter to areas other than the substrate edge WF_S. As described above, the extension part 200 may allow the external part 210 move through the flexible part 230. Even though not illustrated, the extension part 200 and the cover part 300 may be combined, each including the features described above.

According to an example embodiment, in order to allow the misted cleaning liquid CS_M to flow smoothly and to minimize the remaining cleaning liquid CS_C after cleaning within the placement groove 340G, the area of the second cover hole 320H may be equal to or larger than the area of the first cover hole 310H. Further, in an example embodiment, the flux of the cleaning liquid CS_C after cleaning passing through the second cover hole 320H may be equal to or greater than the flux of the misted cleaning liquid CS_M passing through the first cover hole 310H.

Figure 18:
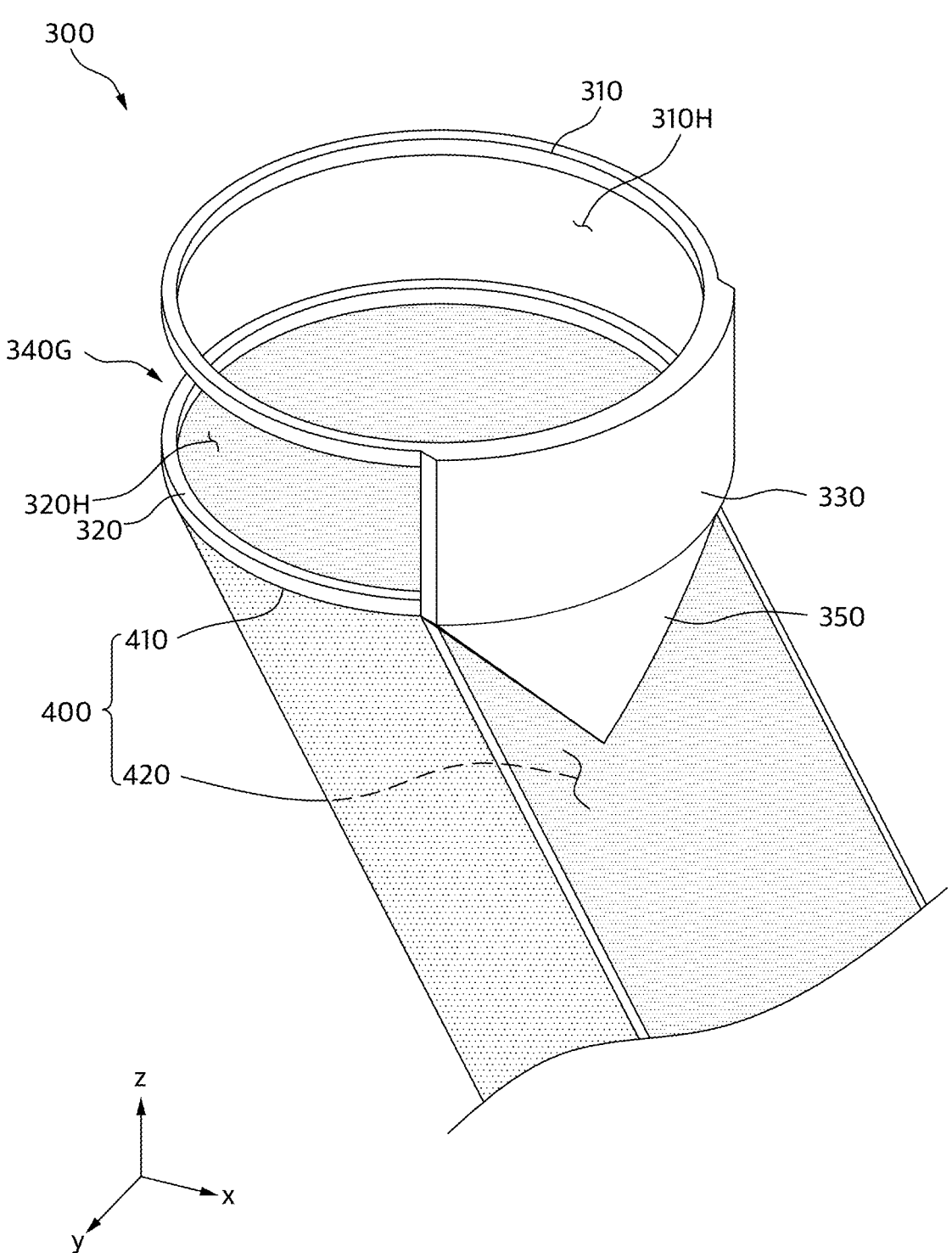
FIGS. 18 and 19 each illustrate that a discharging part is coupled to the cover part of a cleaning apparatus according to an example embodiment.
Figure 19:
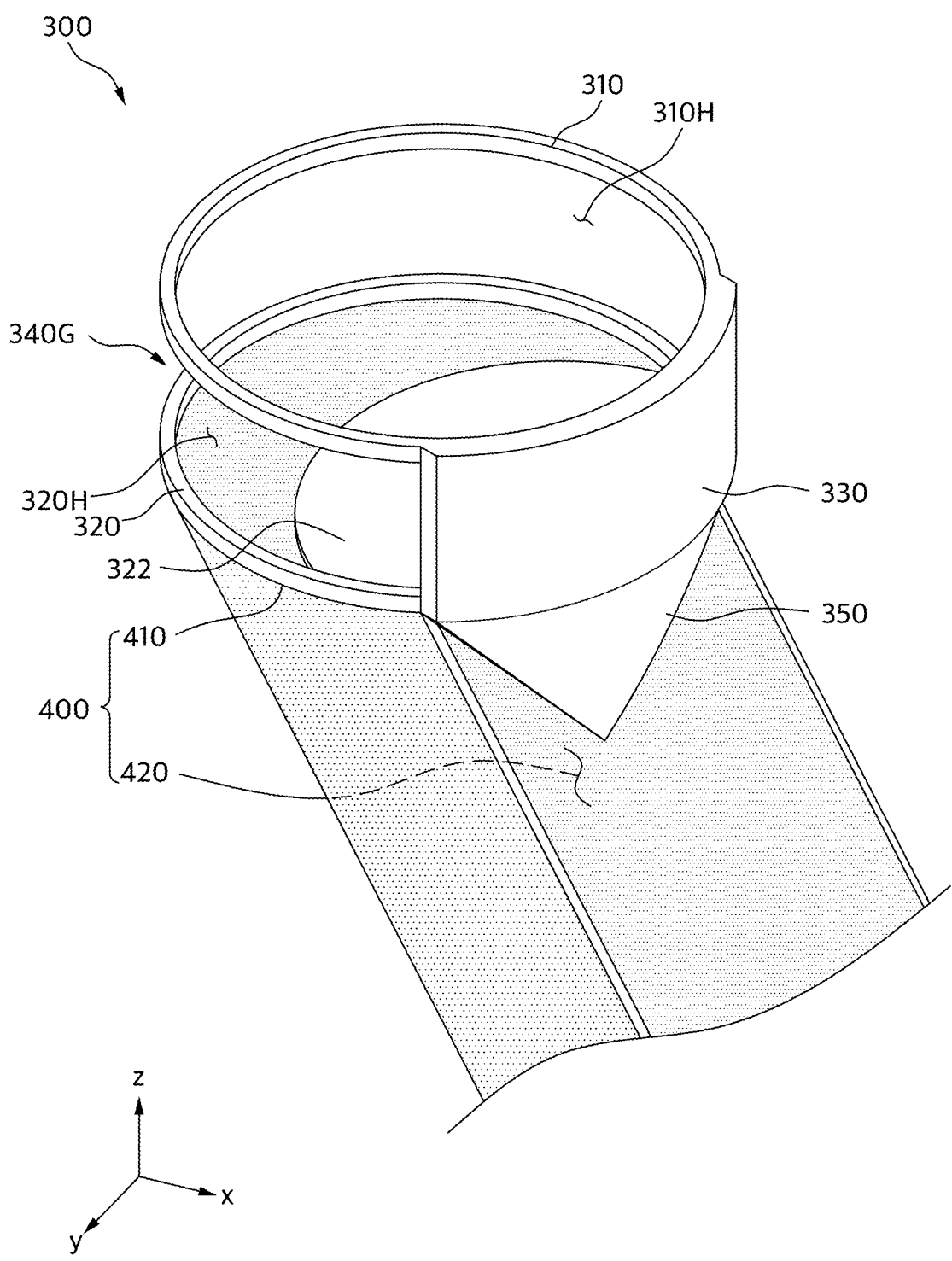
Figure 20:
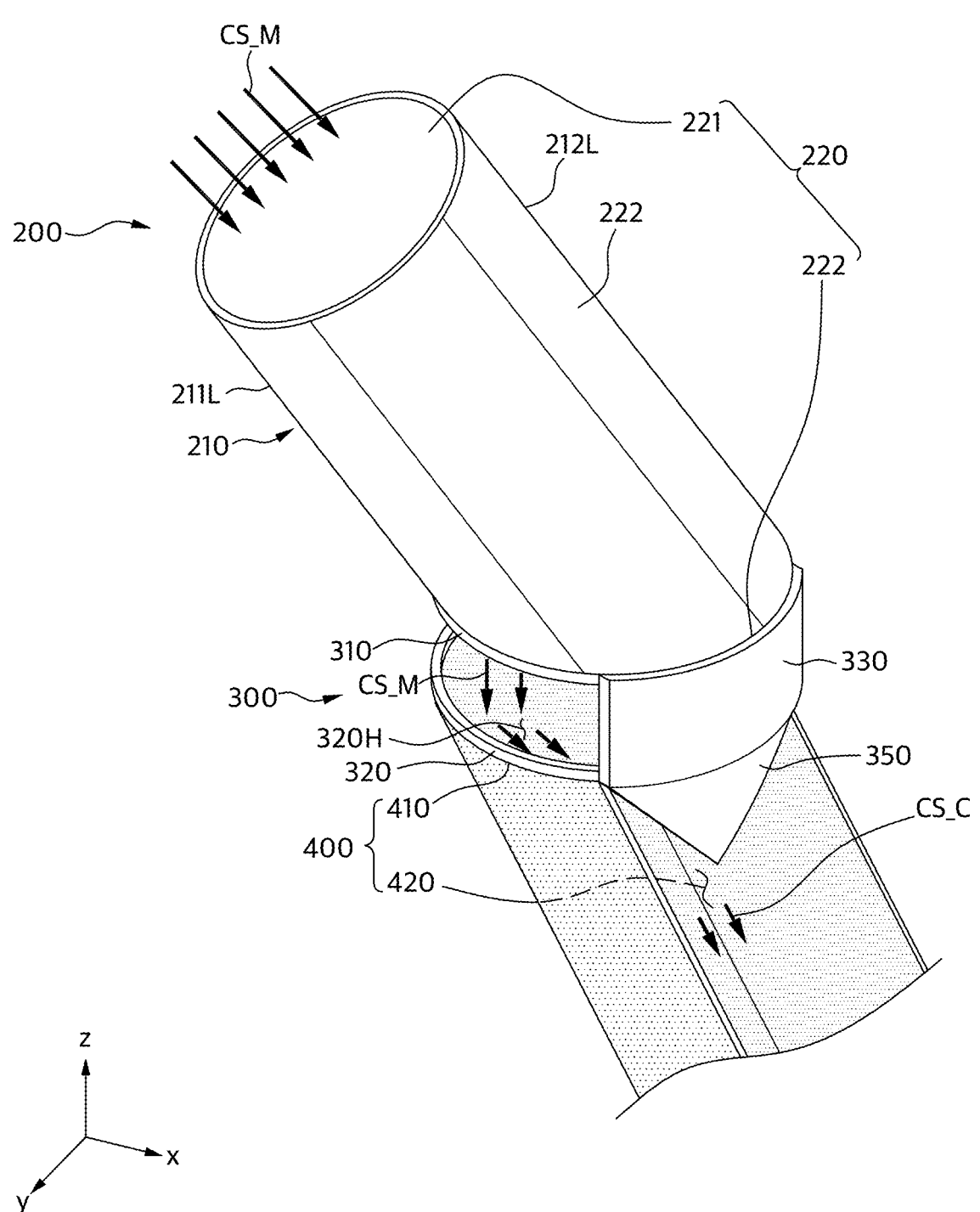
FIG. 20 illustrates that an extension part, a cover part, and a discharging part of a cleaning apparatus are combined according to an example embodiment.

FIGS. 18 and 19 each illustrate that a discharging part 400, also referred to as a discharge extension, is coupled to the cover part 300 of the cleaning apparatus 10 according to an example embodiment. FIG. 20 illustrates that an extension part 200, the cover part 300, and the discharging part 400 of the cleaning apparatus 10 are combined according to an example embodiment.

According to an example embodiment, the cleaning apparatus 10 may include the discharging part 400 which is connected to the cover part 300, and that includes a discharge path 420 formed by the discharging part through which the cleaning liquid passes. The discharging part 400 may include a discharge opening 410 arranged to be connected to the cover part 300. The cleaning liquid after cleaning may be discharged to the discharge opening 410, and may be discharged to the outside according to the discharge path 420. Meanwhile, according to an example embodiment, the cover part 300 and the discharging part 400 may be integrated.

According to an example embodiment, the discharge opening 410 may be connected to the second cover part 320. The discharge opening 410 and the second cover part 320 may be contacted without any gaps, in order for the misted cleaning liquid CS_M and the cleaning liquid CS_C after cleaning not to scatter to areas other than the substrate edge WF_S. The opening area of the discharge opening 410 may be larger than the area of the second cover hole 320H. Further, based on the vertical direction of the front surface part WF_FS of the substrate edge WF_S, at least a portion of the opening of the discharge opening 410 may overlap the second cover hole 320H. In an example embodiment, based on the vertical direction of the front surface part WF_FS of the substrate edge WF_S, the opening of the discharge opening 410 may entirely overlap the second cover hole 320H. Through the structure, the cleaning liquid CS_C after cleaning may be easily processed.

According to an example embodiment, the discharge path 420 may have an inclined structure based on the vertical direction of the front surface part WF_FS of the substrate edge WF_S in order for the cleaning liquid to pass through the lower side of the third cover part 330. In other words, referring to FIG. 18, the discharge path 420 may have an inclined structure in order for the cleaning liquid to pass through the lower side of the third cover part 330 (that is, the −z direction). Through the structure, the cleaning liquid CS_C after cleaning being scattered toward the substrate WF is prevented, and the cleaning liquid CS_C after cleaning may be easily discharged.

According to an example embodiment, the discharge path 420 may prevent scattering of the flowing cleaning liquid CS_C after cleaning.

According to an example embodiment, the cross section of the discharge path 420 may have a semicircular or a similar curved surface and may be formed by extending from at least a portion of the second cover part 320. More specifically, the discharge path 420 may be formed by being extended from a portion of the second cover part 320 that does not overlap the part 350 covering scattered liquid. The part 350 covering scattered liquid and the discharge path 420 being formed to completely cover the second cover part 320 may be more advantageous to prevent scattering of the flowing cleaning liquid CS_C after cleaning.

Referring to FIG. 19, as described above, the cover part 300 may include the part 322 for scattering that blocks a portion of the second cover hole 320H. The part 322 for scattering may be connected to the second cover part 320 for structural stability. The part 322 for scattering is connected to the second cover part 320 and may move as one with the second cover part 320. Further, the discharge opening 410 and the second cover part 320 may be contacted without any gaps in order for the cleaning liquid CS_C after cleaning not to scatter to areas other than the substrate edge WF_S. Accordingly, the plane formed by the part 322 for scattering and the plane formed by the discharge opening 410 may be parallel to each other.

According to FIG. 20, the first cover part 310 may be in contact with the second extended opening surface 222 of the extension part 200, and the t contact with the second extended opening surface 222 may be continuous to seal the parts together in order for the misted cleaning liquid CS_M not to scatter to areas other than the substrate edge WF_S. Further, the second cover part 320 may contact the discharge opening 410 of the discharging part 400, and the second cover part 320 may be in contact with the discharge opening 410 without any gaps in order for the cleaning liquid CS_C after cleaning not to scatter to areas other than the substrate edge WF_S. The cleaning liquid CS_C after cleaning may pass through the second cover hole 320H of the second cover part 320 and the opening of the discharge opening 410, and the cleaning liquid CS_C after cleaning may be discharged to the outside along the discharge path 420. Meanwhile, even though it is illustrated that the extension part 200, the cover part 300 and the discharging part 400 are separate elements, but it is only an example embodiment. The extension part 200, the cover part 300 and the discharging part 400 may be configured as one element.

Figure 21:
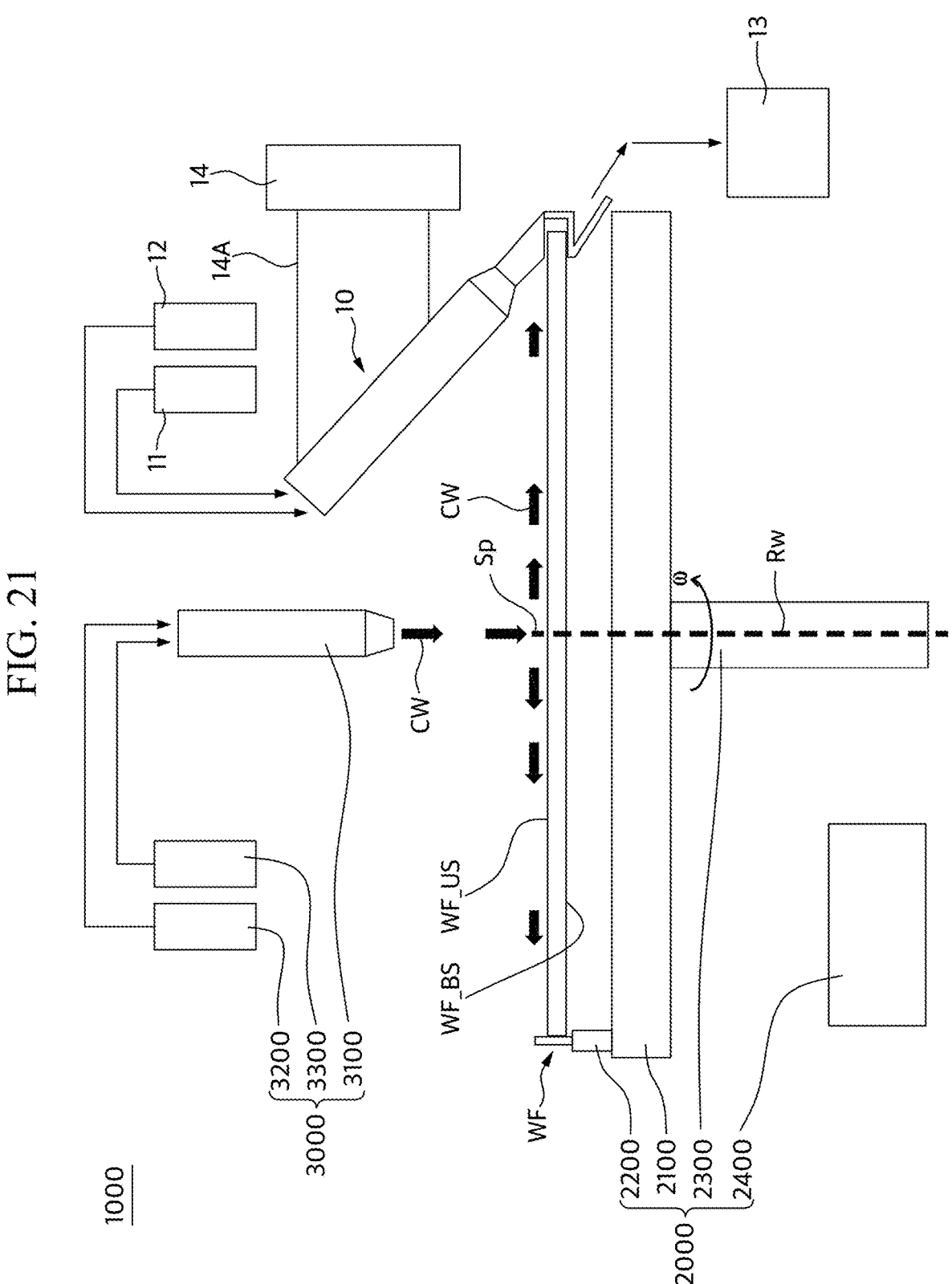
FIGS. 21 and 22 each illustrate that a cleaning apparatus and a substrate processing apparatus are combined according to an example embodiment.
Figure 22:
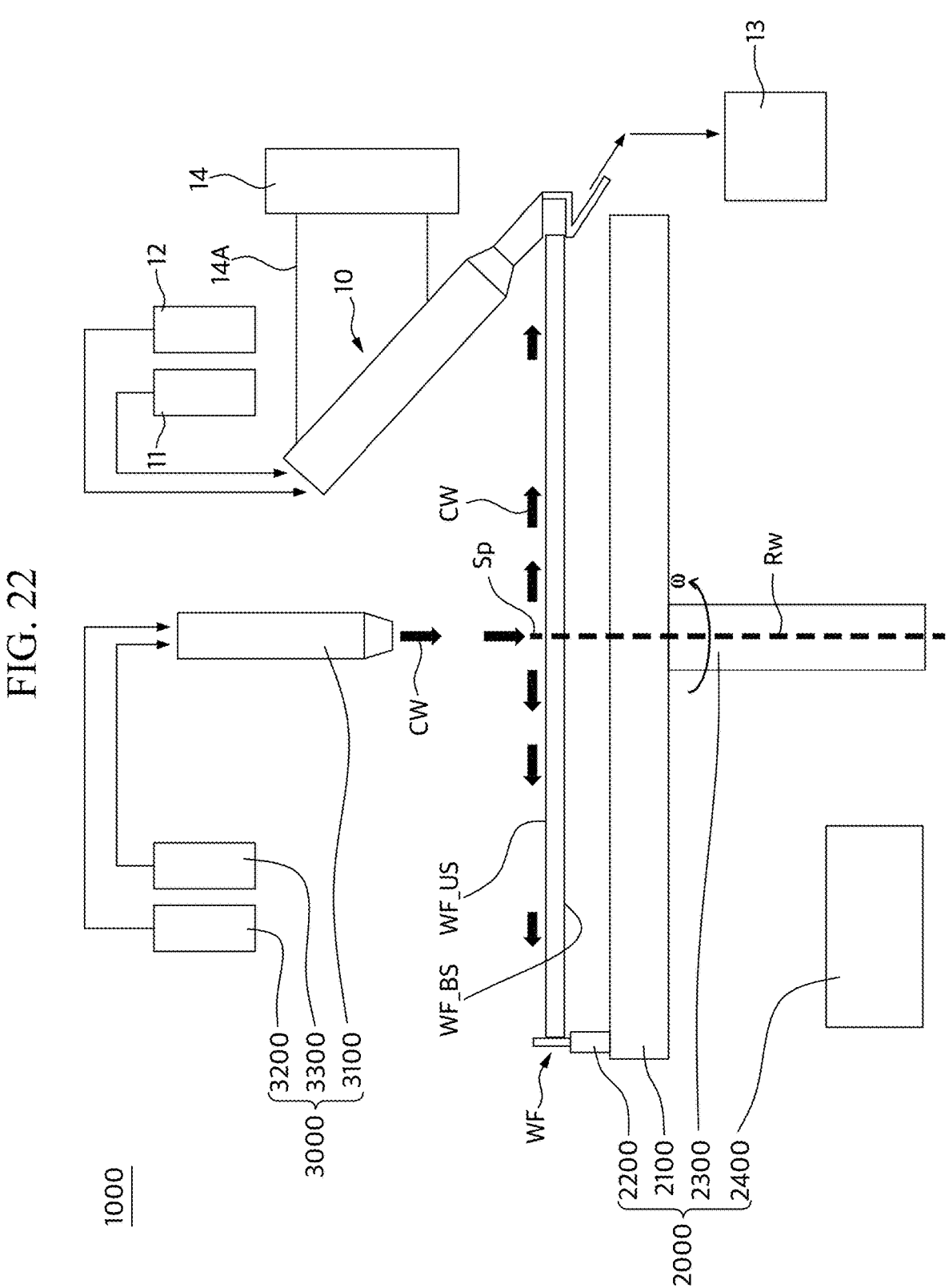

FIGS. 21 and 22 each illustrate an example in which the cleaning apparatus 10 and the substrate processing apparatus 1000 are combined according to an example embodiment. Hereinafter, with respect to the cleaning apparatus 10, unless otherwise specified, reference may be made to the foregoing descriptions. For example, the cleaning apparatus may include the nozzle, nozzle extension, and cover described in connection with FIGS. 1-20.

According to an example embodiment, the substrate processing apparatus 1000 may include the cleaning apparatus 10 for cleaning the substrate WF and a substrate maintaining part 2000, which may be referred to as a substrate support, for maintaining, or supporting the substrate WF in a horizontal state. The substrate WF may include an upper surface WF_US of the substrate including the front surface part WF_FS of the substrate edge WF_S, and a bottom surface WF_BS of the substrate including the rear surface part WF_BkS of the substrate edge WF_S. In the present disclosure, "US" in reference numerals indicates an upper surface, and "BS" in reference numerals indicates a bottom surface. In other words, the upper surface WF_US of the substrate is the part where a thin film is formed, and where a circuit may be formed later.

According to an example embodiment, the substrate maintaining part 2000 may include a rotating part 2300, which may be referred to as a rotating support portion, configured to rotate the substrate WF about a rotation axis RW in a horizontal plane. The substrate maintaining part 2000 may include a chuck rotating apparatus 2400 that provides rotational force, the rotating part 2300 may rotate by driving the chuck rotating apparatus 2400, and the rotational speed ω may be controlled. The substrate maintaining part 2000 may include a spin base 2100 that rotates together with the rotation of the rotating part 2300. The rotating part 2300 and the spin base 2100 may be formed as one element, or may be connected. The shape of spin base 2100 may be the same as that of the substrate WF. For example, if the substrate WF has a disc shape, the spin base 2100 may also have a disc shape.

According to an example embodiment, the rotation speed ω of the substrate WF may be approximately 5 rpm to 1,500 rpm or 10 rpm to 1,2000 rpm. Accordingly, the pressure of the cleaning liquid CS sprayed from the cleaning apparatus 10 may vary. For example, when the rotation speed o of the substrate WF increases, in order to achieve the same cleaning effect, the pressure of the cleaning liquid CS may be increased, and when the rotation speed ω of the substrate WF decreases, in order to achieve the same cleaning effect, the pressure of the cleaning liquid CS may be lowered.

According to an example embodiment, the substrate maintaining part 2000 may include a chuck pin 2200 that secures the substrate WF to the edge part of the spin base 2100. One or more chuck pins 2200 may be placed. The chuck pins 2200 may be placed in appropriate positions in order for the center of gravity of the substrate WF not to change due to rotation. The substrate WF fixed by the chuck pins 2200 may be rotated along the rotation axis RW in the horizontal plane according to the spin base 2100 rotating by the rotating part 2300.

According to an example embodiment, in the substrate processing apparatus 1000, the cleaning apparatus 10 may be arranged so that the substrate edge WF_S is located in the placement groove 340G. Since the substrate WF rotates, the cleaning apparatus 10 may remove a thin film unnecessarily formed on the substrate edge WF_S from a fixed position.

According to an example embodiment, the substrate processing apparatus 1000 may include a spray apparatus 3000 that sprays spray liquid CW onto the upper surface WF_US of the substrate. The substrate WF may be arranged so that the upper surface WF_US of the substrate is adjacent to the spray apparatus 3000 and the bottom surface WF_BS of the substrate is adjacent to the spin base 2100. Referring to FIGS. 21 and 22, the substrate WF may be placed so that the upper surface WF_US of the substrate faces the +z direction and the bottom surface WF_BS of the substrate faces the −z direction. The spray liquid CW is intended to flow the cleaning liquid CS scattered on the substrate WF or to clean the substrate WF rather than removing the thin film. For the type of the spray liquid CW, the above descriptions regarding the cleaning liquid CS may be referred to. The spray liquid CW may have lower pressure compared to the cleaning liquid CS. The spray liquid CW may be liquid at normal pressure and room temperature.

According to an example embodiment, the spray apparatus 3000 may include a spraying part 3100 spraying the spray liquid CW and a spray liquid providing part 3200 supplying the spray liquid CW to the spraying part 3100. The spray liquid providing part 3200 may include a pressurizing means such as a pump (not illustrated) to supply the spray liquid CW to the spraying part 3100, and may include a storage tank (not illustrated) for storing the spray liquid CW. Meanwhile, the spray apparatus 3000 may spray gas (not illustrated) on the substrate WF through the spraying part 3100 to help clean the substrate WF, and the gas (not illustrated) may be sprayed like the spray liquid CW. Further, the spray apparatus 3000 may include a central gas providing part 3300 that supplies gas, and the central gas providing part 3300 may include a pressurizing means such as a pump (not illustrated) to supply gas to the spraying part 3100, and may include a gas storage tank (not illustrated) for storing the gas.

According to an example embodiment, the spray liquid CW may be sprayed on the upper surface WF_US of the substrate, and due to the rotation of the rotating part 2300, the spray liquid CW may move to the substrate edge WF_S. Even in the structure of the cleaning apparatus 10, by flowing the cleaning liquid CS scattered on the substrate WF, the spray liquid CW moved to the substrate edge WF_S may complement the function of the cleaning apparatus 10.

According to an example embodiment, with respect to the spray apparatus 3000, based on the vertical direction of the front surface part WF_FS of the substrate edge WF_S, an area SP in contact with the spray liquid CW sprayed from the spray apparatus 3000 and the upper surface WF_US of the substrate may overlap the rotation axis RW by the rotating part 2300. In other words, the spraying part 3100 may be placed in order for an area SP in contact with the spray liquid CW sprayed from the spray apparatus 3000 and the upper surface WF_US of the substrate to overlap the rotation axis RW by the rotating part 2300. Consequently, when the spray liquid CW is sprayed on the substrate WF in order for the spray liquid CW to overlap the rotation axis RW, the substrate WF is efficiently cleaned, and the cleaning liquid CS scattered on the substrate WF may be flowed.

Referring to FIGS. 21 and 22, the substrate processing apparatus 1000 may further include a moving apparatus 14 arranged to move the cleaning apparatus 10 in a horizontal direction (that is, the x-axis direction) with respect to the horizontal around which the substrate WF rotates. The moving apparatus 14 may include an arm 14A connected to the cleaning apparatus 10, and through the operation of the arm 14A, the cleaning apparatus 10 may be moved in a horizontal direction with respect to the horizontal plane. By moving the cleaning apparatus 10 in the horizontal direction, the area range the substrate edge WF_S may be adjusted.

According to an example embodiment, the substrate processing apparatus 1000 may include a cleaning liquid providing part 11 that provides the cleaning liquid CS to the cleaning apparatus 10 and the gas providing part 12 that provides the gas GS. The cleaning liquid providing part 11 may include a pressurizing means such as a pump (not illustrated) to supply the cleaning liquid CS, and may include a storage tank (not illustrated) for storing the cleaning liquid CS. The gas providing part 12 may include a pressurizing means such as a pump (not illustrated) to supply the gas GS, and may include a gas storage tank (not illustrated) for storing the gas GS. Further, the substrate processing apparatus 1000 may include a wastewater part 13 where the cleaning liquid CS_C after cleaning in FIG. 20 is discharged from the discharging part 400 of the cleaning apparatus 10 and stored.

Meanwhile, according to an example embodiment, a protective film (not illustrated) may be formed on other parts of the substrate WF except the substrate edge WF_S, and the protective film may be made of a material that is easy to form and remove without physically or chemically interacting with the already formed thin film. Through the protective film, the function of the cleaning apparatus 10 can be supplemented by protecting the already formed thin film even if the cleaning liquid CS sprayed from the cleaning apparatus 10 scatters on the substrate WF.

The example embodiments of the present disclosure are described with reference to the attached drawings. However, the present disclosure is not limited to the example embodiments, and the present disclosure can be manufactured in various other forms, and a person skilled in the art to which the present disclosure pertains will understand that the present disclosure can be implemented in other specific forms without changing its technical idea or essential features. Therefore, the example embodiments described above should be understood in all respects as illustrative and not limiting.

What is claimed is:

1. A cleaning apparatus comprising:

a nozzle configured to spray a cleaning liquid;

a nozzle extension comprising a nozzle extension body having a first aperture at a first end coupled to the nozzle and a second aperture at a second end, the first aperture and the second aperture connected by a fluid passage in the nozzle extension body, the first aperture aligned with the nozzle and the second aperture for discharging the cleaning liquid, and the first aperture and the second aperture each have a respective normal direction oblique to each other; and a cover that encloses the second aperture to receive the cleaning liquid from the second aperture and that comprises a first cover portion configured to cover at least a portion of a front surface of a substrate adjacent to a substrate edge, a second cover portion configured to cover at least a portion of a rear surface of the substrate adjacent to the substrate edge that is opposite the front surface, and a third cover portion configured to cover at least a portion of a side of the substrate edge connecting the front surface, and the rear surface, wherein the cover comprises a placement groove configured to receive the substrate edge, the placement groove being surrounded by the first cover portion, the second cover portion, and the third cover portion.

2. The cleaning apparatus of claim 1, wherein the nozzle comprises an inner wall defining a cleaning liquid path configured to pass the cleaning liquid and an exterior wall surrounding the inner wall.

3. The cleaning apparatus of claim 2, wherein the inner wall further comprises an internal nozzle that communicates the cleaning liquid path with an outlet of the internal nozzle configured to eject the cleaning liquid.

4. The cleaning apparatus of claim 3, wherein a cross-sectional area of the cleaning liquid path perpendicular to a direction in which the cleaning liquid passes is larger than a cross-sectional area of the internal nozzle perpendicular to the direction in which the cleaning liquid passes.

5. The cleaning apparatus of claim 3, wherein a space is provided between the exterior wall and the inner wall.

6. The cleaning apparatus of claim 5, wherein the space between the exterior wall and the inner wall is configured to pass a gas through the space, wherein the internal nozzle is configured to cause a gas leaving the space to contact a cleaning liquid ejected from the outlet.

7. The cleaning apparatus of claim 6, wherein a pressure of the gas is greater than a pressure of the cleaning liquid ejected through the outlet.

8. The cleaning apparatus of claim 1, wherein the nozzle extension body comprises a flow changing portion configured to change a flow direction of a cleaning liquid passing therethrough.

9. The cleaning apparatus of claim 8, wherein lateral surfaces of the nozzle extension body have differing lengths.

10. The cleaning apparatus of claim 9, wherein the nozzle extension further comprises a flexible portion configured to flex in a lateral direction, wherein the nozzle extension body is connected with the flexible portion.

11. The cleaning apparatus of claim 1, wherein the first cover portion has a first cover hole formed therein, wherein the second cover portion has a second cover hole formed therein, and wherein cover is configured to pass the cleaning liquid through the first cover hole and the second cover hole.

12. The cleaning apparatus of claim 11, wherein the second cover portion is oblique to a plane formed by the rear surface of the substrate.

13. The cleaning apparatus of claim 11, wherein the cover further comprises a scatter portion that blocks a portion of the second cover hole.

14. The cleaning apparatus of claim 1, wherein the cover comprises an edge extension having an inclined surface slanted in a direction toward the placement groove, and the edge extension is connected to the third cover portion.

15. The cleaning apparatus of claim 1, further comprising a discharge extension that is connected to the cover, and that includes a discharge path formed therein through which the cleaning liquid passes is able to pass, wherein the discharge extension has an inclined structure to guide the cleaning liquid to pass through a lower side of the third cover portion based on a vertical direction of the front surface of the substrate.

16. A substrate processing apparatus comprising a cleaning apparatus configured to clean a substrate and a substrate support that maintains the substrate in a horizontal state, wherein the cleaning apparatus comprises:

a nozzle configured to spray cleaning liquid;

a nozzle extension comprising a nozzle extension body having a first aperture at a first end coupled to the nozzle and a second aperture at a second end, the first aperture and the second aperture connected by a fluid passage in the nozzle extension body, the first aperture aligned with the nozzle and the second aperture for discharging a cleaning liquid, and the first aperture and the second aperture each having a respective normal direction oblique to each other; and a cover that encloses the second aperture to receive the cleaning liquid from the second aperture, and that comprises a first cover portion configured to cover at least a portion of a front surface of a substrate adjacent to a substrate edge, a second cover portion configured to cover at least a portion of a rear surface of a substrate adjacent to the substrate edge, which is an opposite side of the front surface of the substrate, and a third cover portion configured to cover at least a portion of a side surface of the substrate edge connecting between the front surface and the rear surface, wherein the cover comprises a placement groove configured to receive the substrate edge, the placement groove being surrounded by the first cover portion, the second cover portion and the third cover portion, and wherein the substrate support comprises a rotating support portion configured to rotate the substrate along a rotation axis in a horizontal plane.

17. The substrate processing apparatus of claim 16, wherein the substrate processing apparatus further comprising a spray apparatus configured to spray a spray liquid onto an upper surface of a substrate when the substrate is disposed on the rotating support portion, the substrate comprising an upper surface including the front surface of the substrate and a bottom surface including the rear surface of the substrate, wherein the spray liquid moves to the substrate edge due to rotation of the rotating support portion.

18. The substrate processing apparatus of claim 17, wherein the spray apparatus is configured to be positioned to spray the spray liquid at an area of the upper surface of the substrate that overlaps the rotation axis of the front surface of the substrate.

19. The substrate processing apparatus of claim 16, further comprising a moving apparatus that is configured to move the cleaning apparatus in a direction horizontal to the horizontal plane, wherein the moving apparatus comprises an arm that is connected to the cleaning apparatus.

20. A substrate processing apparatus comprising a cleaning apparatus for cleaning a substrate, a substrate support for supporting the substrate in a horizontal state, and a spray apparatus for spraying a spray liquid on the substrate, wherein the cleaning apparatus comprises:

a nozzle configured to spray a cleaning liquid;

a nozzle extension comprising a nozzle extension body having a first aperture at a first end coupled to the nozzle and a second aperture at a second end, the first aperture and the second aperture connected by a fluid passage in the nozzle extension body, the first aperture aligned with the nozzle and the second aperture for discharging the cleaning liquid, and the first aperture and the second aperture each have a respective normal direction oblique to each other;

a cover that encloses the second aperture to receive the cleaning liquid from the second aperture, and that comprises a first cover portion configured to cover at least a portion of a front surface of a substrate adjacent to a substrate edge, a second cover portion configured to cover at least a portion of a rear surface of the substrate adjacent to the substrate edge, which is an opposite side of the front surface, and a third cover portion configured to cover at least a portion of a side surface of the substrate edge connecting between the front surface and the rear surface; and a discharge extension that is connected to the cover, and that includes a discharge path through which the cleaning liquid may pass, wherein the nozzle comprises an inner wall defining a cleaning liquid path through which the cleaning liquid is able to pass and an exterior wall surrounding the inner wall, wherein the inner wall further comprises an internal nozzle that communicates the cleaning liquid path with an outlet of the internal nozzle for ejecting the cleaning liquid, wherein a space is provided between the exterior wall and the inner wall, wherein the space between the exterior wall and the inner wall is configured to pass a gas therethrough and the internal nozzle is configured to cause a gas leaving the space to contact the cleaning liquid that is ejected from the outlet, wherein the nozzle extension body comprises a flow changing portion configured to change a flow direction of the cleaning liquid passing therethrough, wherein the first cover portion has a first cover hole formed therein, the second cover portion has a second cover hole formed therein, and the cover is configured to pass the cleaning liquid through the first cover hole and the second cover hole, wherein the cover comprises a placement groove configured to receive the substrate edge, the placement groove being surrounded by the first cover portion, the second cover portion and the third cover portion, wherein the discharge extension has an inclined structure to guide the cleaning liquid to pass through a lower side of the third cover portion based on a vertical direction of the front surface of the substrate, and wherein the substrate support comprises a rotating support portion configured to rotate the substrate about a rotation axis in a horizontal plane.

* * * * *